(12) United States Patent
Stowers et al.

(10) Patent No.: US 9,281,207 B2
(45) Date of Patent: Mar. 8, 2016

(54) SOLUTION PROCESSIBLE HARDMASKS FOR HIGH RESOLUTION LITHOGRAPHY

(75) Inventors: Jason K. Stowers, Corvallis, OR (US); Stephen T. Meyers, Corvallis, OR (US); Michael Kocsis, San Francisco, CA (US); Douglas A. Keszler, Corvallis, OR (US); Andrew Grenville, Eugene, OR (US)

(73) Assignee: Inpria Corporation, Corvallis, OR (US)

( * ) Notice: Subject to any disclaimer, the term of this patent is extended or adjusted under 35 U.S.C. 154(b) by 675 days.

(21) Appl. No.: 13/407,541

(22) Filed: Feb. 28, 2012

(65) Prior Publication Data

US 2012/0223418 A1    Sep. 6, 2012

Related U.S. Application Data

(60) Provisional application No. 61/447,477, filed on Feb. 28, 2011.

(51) Int. Cl.
*H01L 29/06*    (2006.01)
*H01L 21/308*    (2006.01)
(Continued)

(52) U.S. Cl.
CPC ............ *H01L 21/3081* (2013.01); *C23C 18/06* (2013.01); *C23C 18/1216* (2013.01); *G03F 7/091* (2013.01); *G03F 7/094* (2013.01); *H01L 21/02178* (2013.01); *H01L 21/02181* (2013.01);
(Continued)

(58) Field of Classification Search
CPC ............ H01L 21/31641; H01L 21/0338; H01L 21/3088; H01L 21/3081

USPC .................................. 257/410, 618
See application file for complete search history.

(56) References Cited

U.S. PATENT DOCUMENTS 3,385,915 A    5/1968    Hamling
4,102,683 A    7/1978    DiPiazza
(Continued)

FOREIGN PATENT DOCUMENTS

JP    03-148659 A    6/1991
JP    2001272786    10/2001
(Continued)

OTHER PUBLICATIONS

International Search Report and the Written Opinion from the corresponding PCT Application No. PCT/US2012/027002 mailed Sep. 25, 2012 (13 pages).
(Continued)

*Primary Examiner* — Marc Armand
*Assistant Examiner* — Tifney Skyles
(74) *Attorney, Agent, or Firm* — Dardi & Herbert, PLLC; Peter S. Dardi; Kayla J. Fossen

(57) ABSTRACT

Solution processible hardmasks are described that can be formed from aqueous precursor solutions comprising polyoxometal clusters and anions, such as polyatomic anions. The solution processible metal oxide layers are generally placed under relatively thin etch resist layers to provide desired etch contrast with underlying substrates and/or antireflective properties. In some embodiments, the metal oxide hardmasks can be used along with an additional hardmask and/or antireflective layers. The metal oxide hardmasks can be etched with wet or dry etching. Desirable processing improvements can be obtained with the solution processible hardmasks.

19 Claims, 9 Drawing Sheets

(51) Int. Cl.

| | | |
|---|---|---|
| *H01L 21/316* | (2006.01) | |
| *C23C 18/06* | (2006.01) | |
| *C23C 18/12* | (2006.01) | |
| *H01L 21/02* | (2006.01) | |
| *H01L 21/311* | (2006.01) | |
| *G03F 7/09* | (2006.01) | |
| *H01L 21/033* | (2006.01) | |
| *G03F 7/16* | (2006.01) | |

(52) U.S. Cl.
 CPC .... *H01L 21/02189* (2013.01); *H01L 21/02194* (2013.01); *H01L 21/02282* (2013.01); *H01L 21/0332* (2013.01); *H01L 21/31122* (2013.01); *H01L 21/31641* (2013.01); *G03F 7/16* (2013.01); *H01L 21/0338* (2013.01); *H01L 21/3088* (2013.01)

(56) References Cited

U.S. PATENT DOCUMENTS

| | | | |
|---|---|---|---|
| 4,370,405 | A | 1/1983 | O'Toole et al. |
| 4,732,841 | A | 3/1988 | Radigan |
| 4,891,303 | A | 1/1990 | Garza et al. |
| 4,910,122 | A | 3/1990 | Arnold et al. |
| 5,025,094 | A | 6/1991 | King |
| 5,672,243 | A | 9/1997 | Hsia et al. |
| 6,020,269 | A | 2/2000 | Wang et al. |
| 6,060,380 | A | 5/2000 | Subramanian et al. |
| 6,183,716 | B1 | 2/2001 | Sleight et al. |
| 6,194,323 | B1 | 2/2001 | Downey et al. |
| 6,197,896 | B1 | 3/2001 | Aviram et al. |
| 6,268,457 | B1 | 7/2001 | Kennedy et al. |
| 6,287,951 | B1 | 9/2001 | Lucas et al. |
| 6,420,088 | B1 | 7/2002 | Angelopoulos et al. |
| 6,583,071 | B1 | 6/2003 | Weidman et al. |
| 6,730,454 | B2 | 5/2004 | Pfeiffer et al. |
| 6,844,604 | B2 | 1/2005 | Lee et al. |
| 6,927,108 | B2 | 8/2005 | Weng et al. |
| 6,946,677 | B2 | 9/2005 | Ostergard |
| 7,001,821 | B2 | 2/2006 | Aggarwal et al. |
| 7,208,341 | B2 | 4/2007 | Lee et al. |
| 7,256,129 | B2 | 8/2007 | Nam et al. |
| 7,773,365 | B2 | 8/2010 | Herman et al. |
| 7,799,503 | B2 | 9/2010 | Brodsky et al. |
| 8,053,370 | B2 | 11/2011 | Yang et al. |
| 8,092,703 | B2 | 1/2012 | Ishibashi et al. |
| 2006/0088962 | A1 | 4/2006 | Herman et al. |
| 2006/0234138 | A1 | 10/2006 | Fehlhaber et al. |
| 2008/0055597 | A1 | 3/2008 | Sun et al. |
| 2009/0174036 | A1 | 7/2009 | Fuller et al. |
| 2010/0044698 | A1 | 2/2010 | Herman et al. |
| 2010/0184259 | A1 | 7/2010 | Radigan et al. |
| 2011/0045406 | A1 | 2/2011 | Keszler et al. |
| 2011/0206599 | A1 | 8/2011 | Keszler et al. |
| 2011/0293888 | A1 | 12/2011 | Stowers et al. |

FOREIGN PATENT DOCUMENTS

| | | |
|---|---|---|
| JP | 2006-284947 | 10/2006 |
| WO | 2005/043246 | 5/2005 |
| WO | 2008082448 | 7/2008 |
| WO | 2009120169 | 10/2009 |

OTHER PUBLICATIONS

Ahmed et al., "Synthesis and Characterization of Zirconium and Hafnium Sulfates, Hydroxide Sulfates and Oxide Sulfates", Acta Chemica Scandinavica, 53, 24-33, 1999.
International Standard ISO, "Space Enviornment (natural and artificial)—Process for determining solar irradiances" First Edition 2007, Reference No. ISO 21348:2007(E) 20 pages.
Stowers et al., "Directly patterned inorganic hardmask for EUV lothography", Proc. SPIE 7969, 796915, 2011 (Abstract Only).
Stowers, "Direct Patterning of Solution Deposited Metal Oxides" A dissertation to Oregon State University, Aug. 14, 2008, 149 pages.
Stowers et al., "High resolution, high sensitivity inorganic resists" Microelectronic Engineering, 86, 730-733, 2009.
Zhang et al., "Stabilization of Cubic $ZrO_2$ with Rh(III) and/or La(III)", Journal of Solid State Chemistry 72, 131-136 (1988).
Zimmerman, "Extension Options for 193nm Immersion Lithography" Journal of Photopolymer Science and Technology, 22, 5, 625-634, 2009 (Abstract Only).
Meyers et al., "Solution-Processed Aluminum Oxide Phosphate Thin-Flim Dielectrics" Chem Mater., 2007, 19, 4023-4029 (Abstract Only).
Nakatta et al., "Improvement of $InGaZnO_4$ Thin Film Transistors Characteristics Utilizing Excimer Laser Annealing" The Japan Society of Applied Physics, 2009 (Abstract Only).
Neef et al., "Effects of carbon/hardmask interactions of hardmask performance" Proceedings of SPIE, 7273, 2009, 72731-1-727311-7.
Owen et al., "1/8 μm optical lithography" J. Vac. Sci. Technol, 3032, 1992 (Abstract Only).
Wang et al.,"$TiO_2$ micro-devices fabricated by laser direct writing" Optics Express, Aug. 29, 2011, 19, 17390-17935.

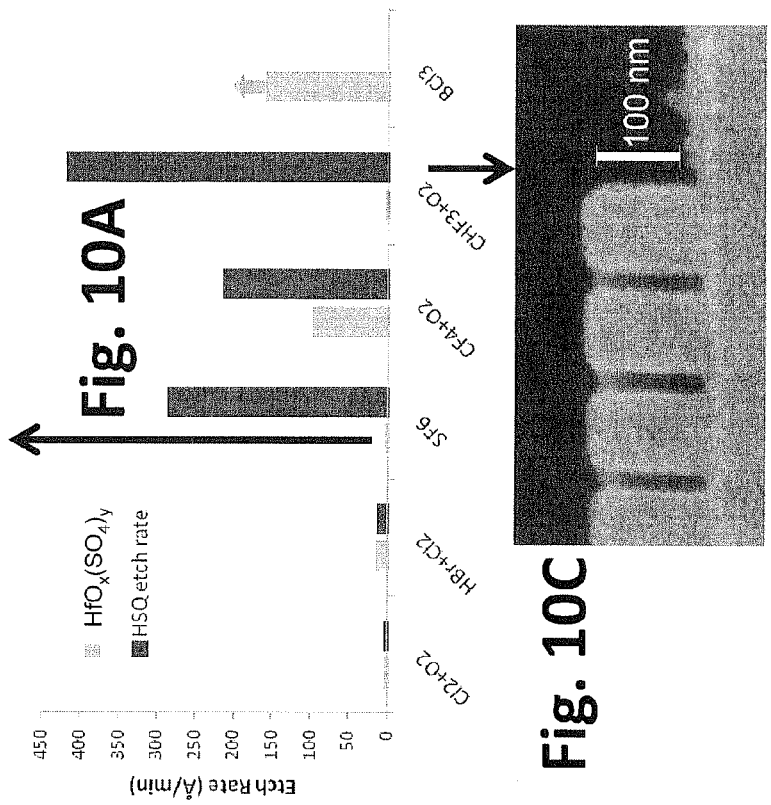
Fig. 10A
Fig. 10B
Fig. 10C
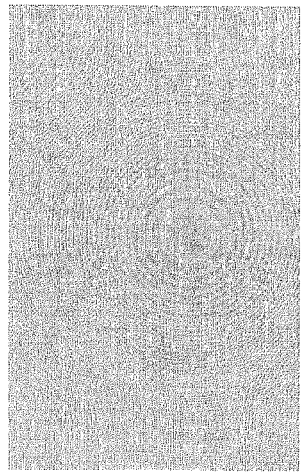
Fig. 9A
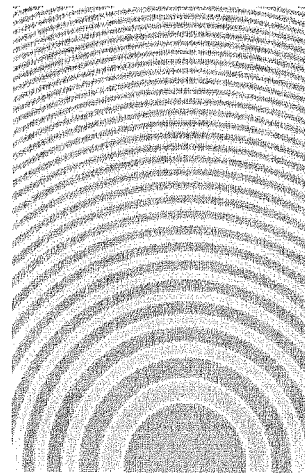
Fig. 9B
Fig. 9C

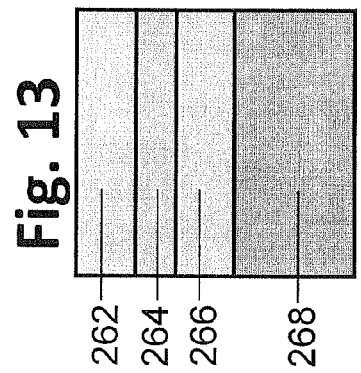
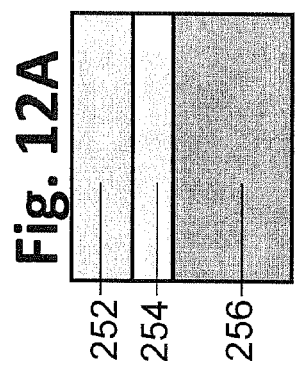
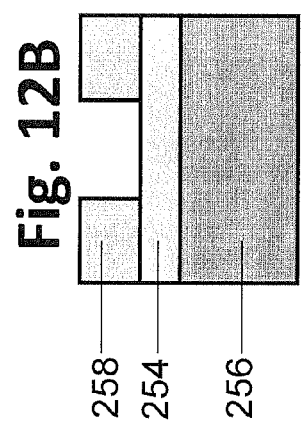
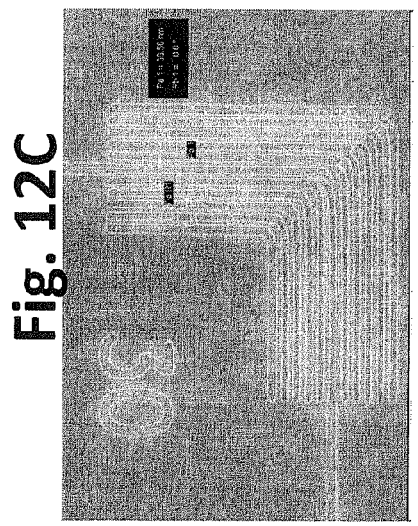
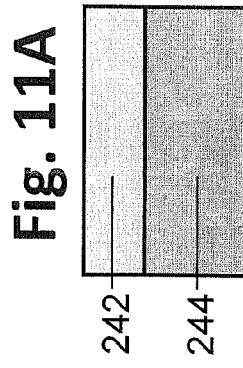
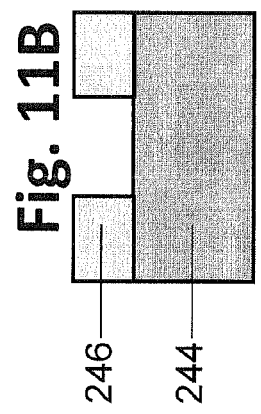
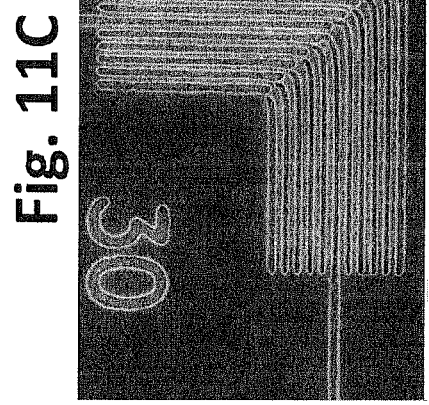

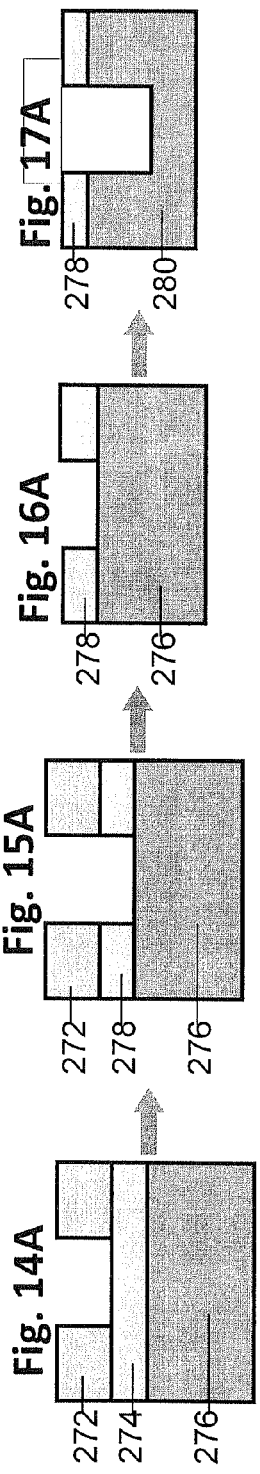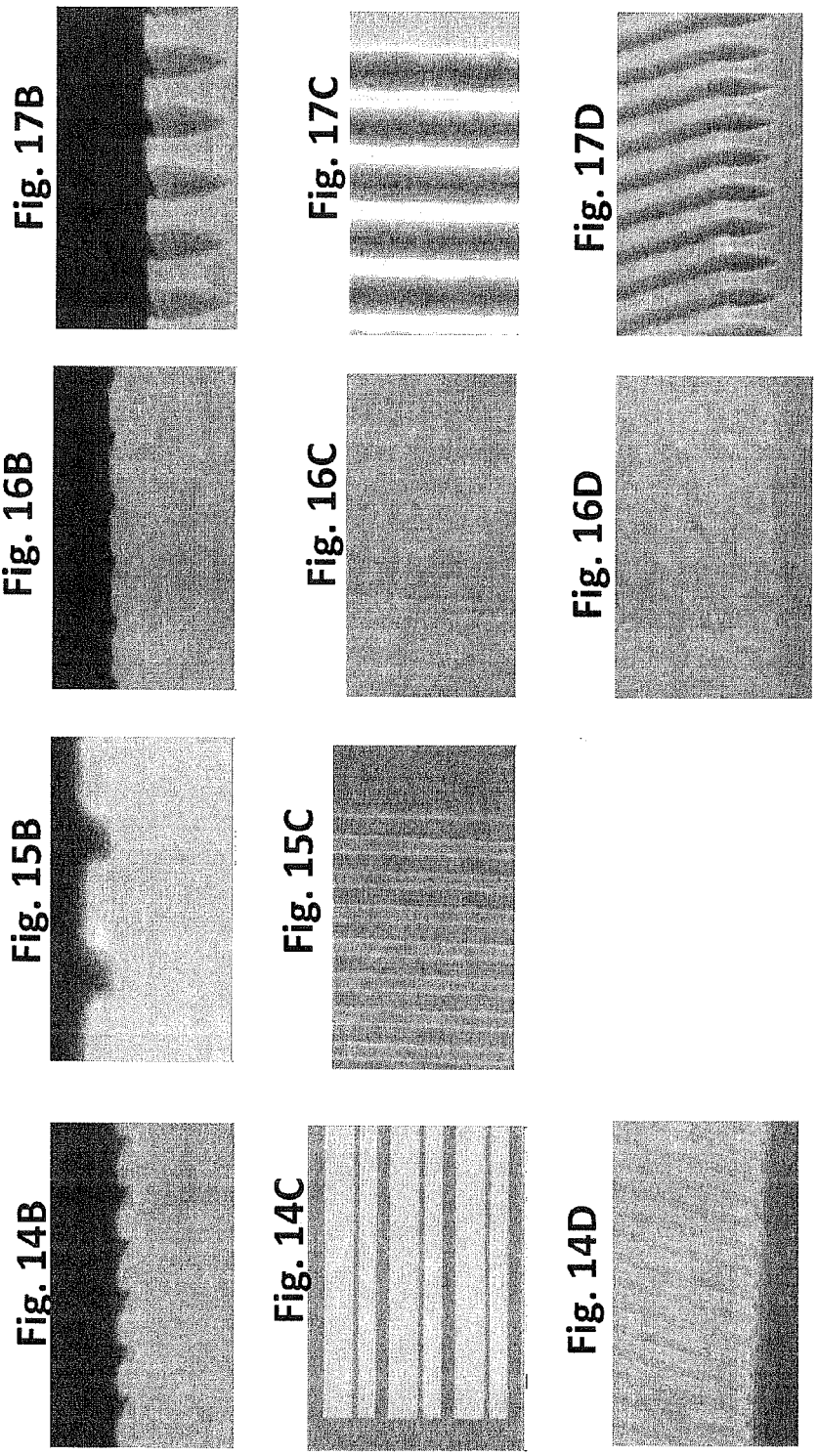

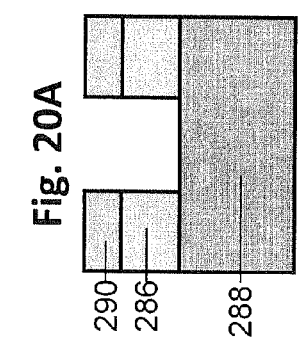
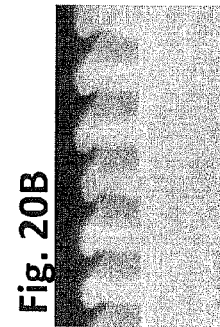
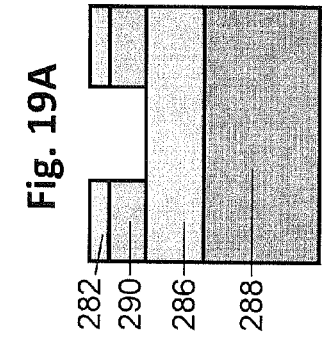
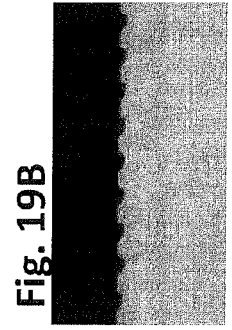
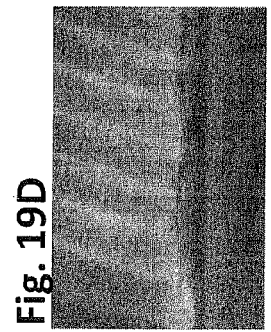
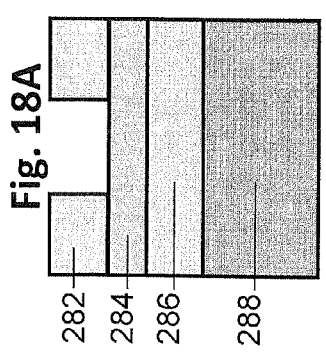
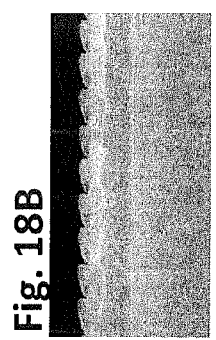
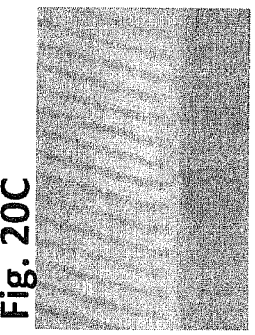
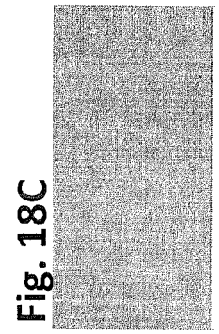

1

SOLUTION PROCESSIBLE HARDMASKS FOR HIGH RESOLUTION LITHOGRAPHY

CROSS REFERENCE TO RELATED APPLICATIONS

This application claims priority to U.S. provisional patent application 61/447,477 to Stowers et al. filed on Feb. 28, 2011, entitled "Solution Processable Inorganic Hardmask," incorporated herein by reference.

STATEMENT AS TO GOVERNMENT RIGHTS

Development of the inventions described herein was at least partially funded with government support through U.S. National Science Foundation grants DGE-0549503 and IIP-0912921, and the U.S. government has certain rights in the inventions.

FIELD OF THE INVENTION

The invention relates to structures with an inorganic hardmask layer comprising metal oxides for patterning inorganic substrates with micron or submicron resolution as well as to the corresponding patterned structure. The substrates can comprise silicon or other semiconductor materials for the formation of integrated circuits or the like. The invention further relates to methods for forming an inorganic hardmask layer using solution deposition techniques.

BACKGROUND OF THE INVENTION

Integrated circuit (IC) fabrication commonly involves sequential deposition and etching steps to pattern the materials that comprise and integrate the discrete devices. Radiation sensitive materials (photoresists) are commonly used to transfer device patterns into functional materials. Processing steps include pattern-defined radiation exposure, pattern development, and then transfer into the functional material via differential etching. Because continued improvement in IC performance is dictated by reduction in device size, progress is gated by advances in photolithographic process resolution. The development of improved resolution photoresists with conventional organic materials, however, is highly constrained by their intrinsic chemical and optical properties. For this reason, various underlayer materials having appropriate optical and chemical properties are now widely used to enhance pattern transfer into functional materials.

As the feature sizes of integrated circuits continue to decrease, thinner layers of photoresist are used to prevent pattern collapse at high-aspect ratios. When combined with the limited etch selectivity between organic photoresists and functional materials, thin resist layers do not have the etch budget to transfer patterns directly into the functional device materials or the substrate. Hardmask (HM) underlayers have been widely adopted as a solution. The developed pattern from the thin photoresist is first etch transferred to the hardmask underlayer with an etch chemistry that has a much higher etch rate in the hardmask than in the resist. The pattern is then transferred from the hardmask into the functional layer with a different etch chemistry. In this case, the etch rate of the functional layer is much higher than that of the hardmask.

SUMMARY OF THE INVENTION

In a first aspect, the invention pertains to a method for forming a patterned structure by lithography on a layered structure that comprises a substrate, a hardmask composition and a radiation patternable resist layer on the hardmask layer. In general, the method comprises:

applying an aqueous hardmask precursor composition comprising polyoxometal clusters and polyatomic inorganic anions on the substrate, heating the hardmask precursor composition after application to the substrate to yield a metal oxide hardmask layer, depositing the resist layer over the metal oxide hardmask layer, exposing the layered structure to radiation to form an exposed structure with a latent image, and developing the exposed structure to form a patterned resist layer exposing a pattern of the metal oxide layer corresponding with the latent image formed in the resist layer.

In further aspects, the invention pertains to a layered structure comprising a substrate having a surface, a hardmask composition on the substrate surface and a radiation patternable resist layer on the metal oxide hardmask layer. The hardmask composition can comprise polyoxometal clusters and inorganic anions and can have an average thickness from about 1 nm to about 50 nm. The resist layer can have an average thickness from about 10 nm to about 1 micron.

In additional aspects, the invention pertains to a method for forming a radiation patternable layered structure, in which the method comprises heating an aqueous metal oxide precursor solution on a deposition surface to form a solid metal oxide layer and depositing a radiation patternable resist layer on the solid metal oxide layer to form the radiation patternable layered structure having a top resist layer. The solid metal oxide layer can have an average thickness from about 1 nm to about 50 nm. In general, the aqueous metal oxide precursor solution comprises polyoxometal clusters and inorganic anions. The resist layer can have an average thickness from about 10 nm to about 1 micron.

BRIEF DESCRIPTION OF THE DRAWINGS

FIG. 9A is a SEM image of patterned hafnium oxide on 100 nm SiN$_x$.

FIG. 9B is a SEM image showing the enlarged inner rings in zone plate after etch.

FIG. 9C is an SEM image showing enlarged outer ring with spacing equal to 19 nm.

FIG. 10A is a histogram depicting the etch selectivity of a metal oxide hardmask sample against hydrogen silsesquioxane (HSQ) photoresist under different etching conditions.

FIG. 10B is a SEM image of silicon posts with 40 nm width formed after patterning HSQ resist with an electron beam followed by etching of a metal oxide hardmask with a SF$_6$ plasma etch.

FIG. 10C is a SEM image of 100 nm HSQ lines formed after patterning the HSQ resist with an electron beam followed by etching a metal oxide hardmask with a CHF$_3$+O$_2$ plasma etch.

FIG. 11A is a schematic diagram of a two layered structure with an organic resist directly used on a Si substrate.

FIG. 11B is a schematic diagram of the resist of FIG. 11A patterned with an e-beam to form a patterned resist on the Si substrate.

FIG. 11C is a SEM image corresponding with an example of the schemes of FIG. 11A and FIG. 11B with a CAR coated silicon wafer.

FIG. 12A is a schematic diagram of a three layered structure with a hafnium oxide layer between an organic resist and a Si substrate.

FIG. 12B is a schematic diagram of the resist of FIG. 12A patterned with an e-beam to form a patterned resist on the hafnium oxide layer on top of the Si substrate.

FIG. 12C is a SEM image corresponding with an example of the schemes of FIG. 12A and FIG. 12B based on a CAR coated on the hafnium oxide layer on top of a Si substrate.

FIG. 13 is a schematic diagram of a four layered structure with a hafnium oxide layer used on top of another hardmask such as SoC or Si-ARC layer in between an organic resist and a substrate.

FIG. 14A is a schematic diagram of a patterned CAR resist on the hafnium oxide layer on a silicon substrate.

FIG. 14B is a SEM micrograph of the cross section of the patterned CAR resist of FIG. 14A.

FIG. 14C is a SEM micrograph of the top view of the patterned CAR resist lines of FIG. 14B FIG. 14D is the SEM micrograph of the side perspective view of the patterned CAR resist of FIG. 14B.

FIG. 15A is a schematic diagram of the etched hafnium oxide layer on the Si substrate with the patterned CAR resist remaining.

FIG. 15B is a SEM micrograph of the etched cross section of the hafnium oxide layer.

FIG. 15C is a SEM micrograph of the top view of the etched layer of FIG. 15B, showing the open hardmask lines.

FIG. 16A is a schematic diagram of the etched metal oxide hardmask with the CAR resist removed on the Si substrate.

FIG. 16B is a SEM micrograph of the etched cross section of the etched metal oxide hardmask with the CAR resist removed.

FIG. 16C is a SEM micrograph of the top view of the etched metal oxide hardmask with the CAR resist of FIG. 16B removed.

FIG. 16D is a SEM micrograph of the side perspective view of the etched metal oxide hardmask with the CAR resist of FIG. 16B removed.

FIG. 17A is a schematic diagram of the etched silicon substrate with some metal oxide hardmask remaining.

FIG. 17B is a SEM micrograph of the etched cross section of the silicon substrate.

FIG. 17C is a SEM micrograph of the top view of the etched silicon substrate of FIG. 17B.

FIG. 17D is a SEM micrograph of the side perspective view of the etched silicon substrate of FIG. 17B.

FIG. 18A is a schematic diagram of the patterned CAR resist on the Si substrate with the 11 nm hafnium aluminum oxide layer and a spin-on carbon (SoC) hardmask layer in between.

FIG. 18B is a SEM micrograph of the cross section of the patterned CAR resist.

FIG. 18C is a SEM micrograph of the top view of the patterned CAR resist lines of FIG. 18B.

FIG. 19A is a schematic diagram of the etched hafnium aluminum oxide layer on the SoC layer and the Si substrate with some of the patterned CAR resist remaining.

FIG. 19B is a SEM micrograph of the etched cross section of the hafnium aluminum oxide layer.

FIG. 19C is a SEM micrograph of the top view of the etched layer of FIG. 19B, showing the open hardmask lines.

FIG. 19D is a SEM micrograph of the side perspective view of the etched hardmask of FIG. 19B.

FIG. 20A is a schematic diagram of etched SoC with the etched metal oxide hardmask remaining.

FIG. 20B is a SEM micrograph of the etched cross section of the SoC and metal oxide hardmask on the Si substrate.

FIG. 20C is a SEM micrograph of the side perspective view of the etched SoC and metal oxide hardmask on the Si substrate of FIG. 20B.

DETAILED DESCRIPTION OF THE INVENTION

Figure 4:
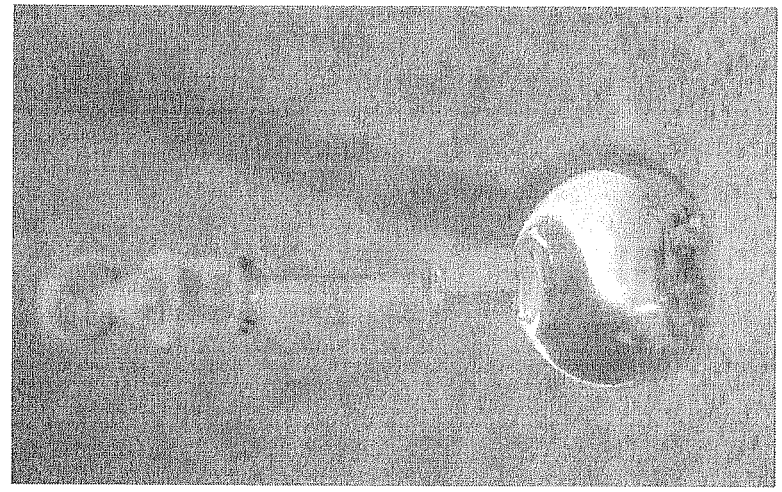
FIG. 4 is a photo of a representative polyoxometal solution indicating the formation of a transparent clear solution.

Solution based compositions incorporating polyoxometal clusters and complex inorganic anions can be used as a precursor solution to deposit thin layers useful as hardmasks for photolithography. We refer to these improved solution-deposited hardmasks to be metal suboxide films. The solution deposited compositions can be heat processed to form complex inorganic hardmasks that have desirable etching properties. In particular, inorganic complex metal suboxide hardmask layers can provide controlled etching relative to a silicon substrate as well as thin films of: an etch photoresist, a silicon containing organic hardmask material, an organic polymer (such as a high carbon content organic polymer), a metal, a metal/metalloid oxide, a nitride, and/or a carbide. In some embodiments, the complex metal suboxide hardmask can be used along with a second hardmask to further improve the resolution of the photolithography process. The hardmask material can be designed to function as an antireflective material for appropriate radiation frequencies. The antireflective properties facilitate further improvement in the resolution of the photolithography process. The solution deposition process is a convenient and cost effective approach for the formation of the hardmask. Coating or printing approaches can be used to form a thin and uniform layer with the precursor solution that can be further processed to cure the hardmask layer. Additional processing can be used to deposit a radiation resist layer, such as a photoresist or an e-beam resist, onto the hardmask, and lithography can then be performed to pattern the material. High resolution structures with a large aspect ratio can be effectively formed with the solution processible hardmasks.

Based on the improved processing approaches described herein, solution depositable complex metal suboxide materials comprising one or more metal cations and polyatomic anions can be effectively used as an improved hardmask to support processing with a polymer based photoresist. Based on ion exchange as described below, the hardmask material can have polyatomic anions removed such that the ultimate material is a metal oxide. For convenience, as used herein including the claims, a reference to a metal oxide can be to either a metal oxide free of polyatomic anions or to a metal suboxide material as described herein. Importantly, these suboxide films can resolve limitations of other metal oxide hardmasks with respect to wafer throughput and commercial use. Commercially, semiconductor wafers are lithographically processed on high-throughput track systems at rates greater than 100 wafers/hour. Vacuum deposition equipment and processing, such as chemical vapor deposition (CVD) and atomic layer deposition (ALD), have low throughput and high capital expense. The improved solution based materials described herein are compatible with track processing, thereby enabling higher throughput and lower capital costs. In addition, they provide excellent planarization properties, low temperature processing and tunable etching and antireflective properties. In particular, the solution processible materials can be formed with high levels of planarity with respect to coating thickness and coating smoothness can be advantageous in the formation of high resolution structures. The smoothness of the coating is useful for the formation of thin hardmask layers that maintain useful etching control. Furthermore, the complex metal suboxide materials can be engineered to have desirable optical properties to reduce reflection back through the material. The ability to reduce reflection can be advantageous with respect to obtaining higher resolution structures from the processing. Thus, the materials described herein can provide both convenient and cost effective processing as well as potential for improved patterning results.

The hardmask materials described herein can be placed between a resist material (such as an organic polymer resist) and an underlying substrate to be etched. Since the complex metal suboxide hardmask can be designed to have desired antireflective properties as well as serving a hardmask function with good etch contrast, a plurality of distinct antireflective-hardmask layers may not be used, although a plurality of hardmask layers between the resist and the functional substrate may still be used even with the improved hardmask materials described herein. A significant function of the hardmask material can be to provide an increased etch differential relative to the substrate in comparison with the resist. Thus, a step-wise etch generally is performed to ultimately pattern the substrate. Once the resist is developed to form a physical pattern in the resist, the hardmask can be etched in one or more steps to expose selected portions of the substrate. Then, the underlying substrate can be etched according to the hardmask pattern, which may involve the sacrifice of the remaining resist. The solution processible complex metal suboxide hardmask can be made thin, uniform, and smooth, which along with the antireflective property provides superior hardmask performance, which in some embodiments can be accomplished with a single layer.

The use of a hardmask layer can be advantageous when using thinner layers of resist material. To obtain high resolution patterns, especially with large aspect ratios, with the lithographic process, the resist layer should be thinner based on the exposure properties of the radiation processing. But if the resist layer is too thin with current commercial polymer resists, the resist may be completely etched off before the substrate is sufficiently etched to a target depth, and the pattern can be lost if the resist is removed prior to the completion of the etching of the substrate. The etch rate differentials between current commercial polymer resists and some desirable substrate materials, especially silicon, are not sufficient to provide for etching structures with very small spacings or high aspect ratio structures with certain substrate materials.

Conventional radiation resists, e.g., photoresists or e-beam resists, generally comprise organic polymers that have desirable radiation absorption properties. A positive resist becomes soluble to resist developer upon exposure to radiation, and a negative resist becomes insoluble to resist developer upon exposure to radiation. The solution processible hardmasks described herein can generally be used with either positive resist or negative resist. To achieve higher resolution features corresponding to a smaller pattern, radiation with a smaller wavelength can be used. Light wavelengths in the ultraviolet are usually used, and electron beam radiation can be used to provide small resolution features.

For fine lithographic patterning, ultraviolet light or electron beam radiation is generally used. Following International Standard ISO 21348 (2007) incorporated herein by reference, ultraviolet light extends between wavelengths of greater than or equal 100 nm and less than 400 nm. A krypton fluoride laser can be used as a source for 248 nm ultraviolet light. The ultraviolet range can be subdivided in several ways under accepted Standards, such as extreme ultraviolet (EUV) from greater than or equal 10 nm to less than 121 nm and far ultraviolet (FUV) from greater than or equal to 122 nm to less than 200 nm. A 193 nm line from an argon fluoride laser can be used as a radiation source in the FUV. EUV light has been used for lithography at 13.5 nm, and this light is generated from a Xe or Sn plasma source excited using high energy lasers or discharge pulses. Soft x-rays can be defined from greater than or equal 0.1 nm to less than 10 nm.

With electron beam lithography, the electron beam generally induces secondary electrons which generally modify the irradiated material. The resolution can be a function at least in part of the range of the secondary electrons in the material in which a higher resolution is generally believed to result from a shorter range of the secondary electrons. Based on high resolution achievable with electron lithography using the inorganic coating materials described herein, the range of the secondary electrons in the inorganic material is limited. Electron beams can be characterized by the energy of the beam, and suitable energies can range from about 5 eV to about 200 keV and in further embodiments from about 7.5 eV to about 100 keV. Proximity-corrected beam doses at 30 keV can range from about 0.1 microcoulombs per centimeter squared ($\mu C/cm^2$) to about 5 millicoulombs per centimeter squared ($mC/cm^2$), in further embodiments from about 0.5 $\mu C/cm^2$ to about 1 $mC/cm^2$ and in other embodiments from about 1 $\mu C/cm^2$ to about 100 $\mu C/cm^2$. A person of ordinary skill in the art can compute corresponding doses at other beam energies based on the teachings herein and will recognize that additional ranges of electron beam properties within the explicit ranges above are contemplated and are within the present disclosure.

The improved solution processable hardmask materials described herein provide many advantages in applications as a hardmask. Relative to current commercial hardmasks comprising organic polymers, polysiloxanes or low-k carbon containing $SiO_2$ hardmask materials, the present complex metal suboxide hardmask materials have very high etch selectivity relative to polymers and tunability of etch rate and antireflective properties relative to all of the materials. Aqueous solution based processes for deposition of the present complex metal suboxide hardmasks provide a relatively inexpensive process and wet rework capability. The high etch resistance and structural integrity of the suboxide films present complex metal suboxide hardmasks resolve a limitation of polysiloxane and carbon-containing $SiO_2$ hardmask materials, which undergo feature thinning during etching. This thinning translates into undesirable critical dimension trimming in underlayers during pattern transfer. The aqueous precursors can be formed into smooth, high quality films with relatively low bake temperatures, in contrast with sol-gel precursors for inorganic hardmasks and with polymer precursors that can form rough, porous layers and/or require high temperature processing (e.g., $SiO_2$ sol-gel precursors). The aqueous inorganic suboxide hardmasks described herein have dissimilar chemical properties from polymer resists, which can be used to limit chemical diffusion across the polymer/suboxide interface. Such control can be used to preserve and potentially enhance the desired patterning performance of the polymer resist by controlling the chemical composition of the resist at the hardmask interface such as the concentration of photoacid generator (PAG) which can lead to resist footing or poisoning. The optical properties of the solution processable hardmasks have tunable optical properties through the variation of the metal cations in the material.

The solution processable hardmask materials can be designed based on several factors. Specifically, the formulation can be designed to achieved target etch properties, desired optical properties associated with the antireflective properties and suitable condensation behavior. In some embodiments, the compositions comprise a plurality of metal cations to facilitate tuning the desired etch properties as well as the desired optical absorption. However, in some embodiments, a single metal cation can be used, and in other embodiments three or more metal cations can be used. The relative amounts of cations, if a plurality of metal cations is used, can be based on a balance of the corresponding properties. The selection of anions and/or the introduction of ligands can be used to influence the condensation properties, as discussed further below.

Reflection of exposure radiation at the bottom surface of the resist can lead to standing waves and intensity variations within the resist layer, making control of the critical pattern dimension difficult. One or more underlayers with matched optical properties can be inserted beneath a conventional resist to reduce reflection and exposure intensity variation associated with standing wave formation. When possible, these antireflection coatings (ARCs) are designed with appropriate chemical etch properties to offer combined functionality as hardmasks as well. The solution processable hardmasks described herein can offer useful functionalities with respect to both etch selectivity and antireflection properties. Moreover, the solution processable materials can be deposited using convenient approaches, such as spin coating, due to desirable solution properties. Thus, process throughput and cost considerations make conveniently applied solution processible materials, e.g., spin coated materials, desirable over vacuum processed layers.

In current lithographic stacks for patterning, a plurality of hardmask layers can be used to reduce corner rounding issues and insufficient etch protection associated with thin resists. The solution processable inorganic suboxide materials described herein can effectively replace vapor deposited metal oxide hardmask layers in a patterning stack. For example, the use of a CVD deposited oxide glass materials is described in U.S. Pat. No. 6,020,269 to Wang et al., entitled "Ultra-thin Resist and Nitride/Oxide Hard Mask for Metal Etch," incorporated herein by reference. The use of a stack with two hard mask layers is described in published U.S. patent application 2010/0184259 to Radigan et al., entitled "Method for Fabricating a 3-D Integrated Circuit Using a Hard Mask of Silicon-Oxynitride on Amorphous Carbon," incorporated herein by reference.

To form the hardmask coating material, a precursor solution can be applied to a surface of a substrate, such as a wafer or the like. In some embodiments, the inorganic precursor solution can have a relatively low concentration of metal ions such that the rheology of the coating composition, e.g., the viscosity, allows the formation of a thin coating on the substrate. The use of a thinner coating is consistent with the formation of higher resolution structures upon exposure to radiation and development of the pattern. The relatively high density and small spatial dimensions of the independently processible chemical moieties of the coating material can be exploited for the formation of structures with reduced linewidth roughness, small feature sizes and/or extremely high resolution.

The coating precursor compositions can comprise an aqueous solution with polyoxometal clusters and polyatomic anions. Polyoxometal clusters are polyatomic cations with a metal element and covalently bonded oxygen atoms with the cluster including the core metal ion and one coordination slayer around the metal ion. The solutions can further comprise other metal cations to influence the light absorption properties of the resulting coating. The precursor solutions can be deposited as described below and processed to form metal suboxide layers with desirable etching capability and antireflective properties. The precursor solutions are suitably stable for processing into thin coating layers that form a hardmask coating layer. The formation of dielectric layers from similar precursor solutions is described in U.S. Pat. No. 7,773,365 to Herman et al., entitled "Dielectric Material," incorporated herein by reference.

In some embodiments, the precursor solutions can further comprise labile ligands comprising peroxide groups. Aqueous solutions of polyoxometal clusters or metal hydroxides can tend to be unstable with respect to gelling and/or precipitation. In particular, the precursor solutions may be unstable upon solvent removal and can form oxo-hydroxide networks. The inclusion of labile ligands can provide additional control of the solutions and/or increase the shelf life of the precursor solutions. The precursor solutions can have been improved control of the precipitation so that heat can be used to induce a curing of the material to introduce desired degrees of etch contrast.

The precursor solutions can be applied as a coating over an entire surface or a portion thereof as described further below. Any reasonable coating or printing method can be used to deposit the precursor solution. The coating can then be dried and heat processed to form the hardmask layer. The hardmask layer can comprise a complex metal suboxide including some structures relating to the complex anions. In general, the resulting material is a dielectric. But significantly, the coating material can be etched selectively using, for example, metal oxide sensitive developing recipes.

Figure 1:
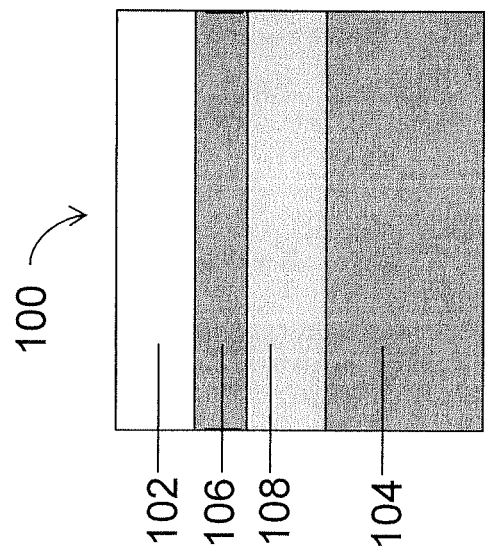
FIG. 1 is a schematic cross sectional view of a structure with a stack of layers for performing radiation lithography.

A conventional high resolution lithography process can use a layer pattern transfer stack with three or more layers on top of a functional material or substrate, see for example, FIG. 1. In this stack 100, a top layer 102 is a resist, such as currently available commercial polymer resists, specific to the exposure radiation and methodology and a bottom layer 104 is a substrate to be ultimately patterned. Middle layers 106 and 108 can be respectively an anti-reflective coating 106 and a hardmask coating 108. Improved complex metal suboxide hardmask coatings described herein can replace one or both of layers 106, 108.

In some previous commercial hardmask applications, middle layer 106 comprises a spin-coated silicon based polymer film which functions as an antireflection layer or coating and to some degree as a hardmask. Pattern transfer from the resist to a silicon based hardmask can be affected by using a halogen ($CF_x$) plasma etch. It is desirable to reduce the thickness and increase the etch selectivity of the antireflective coating-hardmask layer with respect to the resist so that a small thickness of the resists may be used for improved lithography performance. Beneath the antireflective coating-hardmask layer, a carbon-based spin coated hardmask can be used to planarize the surface of the device layers. The carbon layer also tunes absorption and refractive indices to decrease reflection from the substrate surface. Pattern transfer from a silicon antireflective/hardmask to the carbon/hardmask is typically effected with an $O_2$ plasma etch. This carbon hardmask layer is commonly much thicker than the Si hardmask to allow for effective planarization as well as a high etch budget for deep via and trench formation in the substrate. Pattern transfer through this hardmask depends on the underlying functional material, but often involves additional halogen plasma in the case of many inorganic materials.

Desirable features of a hardmask layer include excellent planarization capabilities, etch selectivity relative to a range of functional device layers, as well as any hardmask layer above. Tunable optical properties are also desirable to match a range of functional device materials and pattern transfer layers. The improved solution processible metal suboxide hardmasks described herein can replace one of both of these antireflective and hardmask layers 106, 108 and provide excellent properties with respect to these desired features. To the extent that the improved hardmask materials described herein can replace both layers 106 and 108, the structure to be patterned can have one less layer, and such structures are described in more detail below. Also, additional hardmask layers can be included if desired for processing purposes, and the solution processible metal suboxide hardmask materials can be included in a lithography stack to incorporate desired antireflective and high etching contrast for a particle stack design.

The general uses of lithographic procedures are well known in the electronics art. See, for example, U.S. Pat. No. 7,208,341 to Lee et al., entitled "Method for Manufacturing Printed Circuit Board," Harry J. Levinson, "Principles of Lithography," 2nd Edition, SPIE Press, Monograph Vol. PM146 (2005), and Chris Mack, "Fundamental Principles of Optical Lithography, The Science of Microfabrication," Wiley-Interscience (2007), all three of which are incorporated herein by reference. Generally, for integrated circuit applications, the substrate can be a single crystal silicon wafer, which may include other layers, although other substrates, such as polymers, can be used. In particular, the processing temperatures for the inorganic coating materials described herein are relatively low, so that the formation of patterned inorganic materials as described herein can be performed with very high resolution on substrates that may not be able to be processed without damage at higher temperatures, such as above 600° C. Suitable devices in which elements can be patterned using the inorganic coating materials described herein include, for example, integrated electronic circuits, solar cells, electronic displays and the like.

Precursor Solutions

The precursor solutions can be formulated for deposition using a selected deposition method, such as spin coating. Also, it has been discovered that the formulation of the precursor solutions can be designed to achieve desired levels of radiation absorption for a selected radiation based on the selection of the metal cations. The precursor solutions are based on metal oxide chemistry and aqueous solutions of metal cations with polyatomic anions. The precursor solutions are designed to form a coating composition upon at least partial solvent removal and ultimately an inorganic solid with metal oxides and polyatomic anions.

In some embodiments, the stability of the precursor solution can be increased through incorporation of peroxide based ligands that interact in the aqueous solutions with the metal cations. In particular, if the mole ratio of peroxide groups to the metal cations is at least 0.5, very stable solutions can be formed. The more stable precursor solutions can provide better shelf life and greater control of material curing. The precursor solutions with peroxide based ligands can be cured at appropriate temperatures and times to fully condense the material through substantially disrupting the peroxide metal ion bonds. The cured hardmask material can be further processed similarly to the materials that were formed from precursors solutions without peroxide-based ligands.

The aqueous precursor solutions generally comprise one or more metal cations. In aqueous solutions, metal cations are hydrated due to interactions with the water molecules. The nature of the interactions is generally pH dependent. Specifically, hydrolysis and condensation can take place to bond oxygen atoms to the metal ion to form hydroxide ligands or oxo bonds with the corresponding release of hydrogen ions. As additional hydrolysis takes place, the solutions can become unstable with respect to precipitation of the metal oxide or with respect to gelation. Ultimately, it is desirable to form the solid oxide material, but this progression to the solid oxide is controlled as part of the procedure for processing the solution first to a coating material and then to the ultimate metal oxide composition with structural characteristics contributed by the polyatomic anions. Solvent removal can contribute to the formation of the oxide. In addition, polyatomic anions can be substituted through ion exchange reactions or eliminated by heating. For example, based on ion exchange, a polyatomic anion may be replaced by one or more $OH^-$ groups by exposing the coating material to an aqueous base. The anions $NO_3^-$ and $O_2^{2-}$ may be eliminated with mild heating. Thus, the composition of the coating material can be altered to achieve desired properties of the coating material.

Thus, the aqueous precursor solutions of the metal cations are poised for further processing. In particular, it can be desirous to form polyoxometal clusters that can poise the solution further toward a metal oxide composition. In general, the precursor solution comprises from about 0.01M to about 1.4M total metal cation, in further embodiments from about 0.05M to about 1.2M, and in additional embodiments from about 0.1M to about 1.0M. A person of ordinary skill in the art will recognize that additional ranges of metal cations within the explicit ranges above are contemplated and are within the present disclosure. The metal cations can be added as suitable salts, such as nitrates or halides salts, e.g., chlorides, fluorides, bromides, iodides or combinations thereof. Based on the use of the polyoxometal clusters in the precursor solutions, relatively low levels of heating can be used to form the oxides. To the extent that additional stability of gelation is desired, peroxide-based anions and ligands can be included in the solution to maintain improved process control of the solutions. It has been found that peroxide-based anions and ligands can hinder the formation of a metal-oxygen network that leads to gelation and ultimately precipitation. Thus, the peroxide can be used to form a stable state that can be quickly condensed upon rupture of the peroxide bonds.

Various metal ions can be provided for the formation of polyoxometal clusters, such as $Cr^{6+}$, $Mo^{6+}$, $W^{6+}$, $V^{5+}$, $Nb^{5+}$, $Ta^{5+}$, $Sb^{5+}$, $Ti^{4+}$, $Zr^{4+}$, $Hf^{4+}$, $Sn^{4+}$, $Ce^{4+}$, $Ru^{4+}$, $Sb^{3+}$, $Bi^{3+}$, $Y^{3+}$, $Ga^{3+}$, $Cr^{3+}$, $Fe^{3+}$, $Al^{3+}$, $Co^{3+}$, $Ru^{3+}$, $In^{3+}$, $Sc^{3+}$, $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$, $Zn^{2+}$, $Mn^{2+}$, $Co^{2+}$, $Ni^{2+}$, $Cu^{2+}$, $Mg^{2+}$, $Ca^{2+}$, $Sr^{2+}$, and $Ba^{2+}$. As noted above, the state of the cations in solution is pH dependent, such that the initial state of oxygen coordination can change in solution, but the trend is toward hydrolysis leading to oxide formation.

The metal cations generally significantly influence the absorption of radiation. Therefore, the metal cations can be selected based on the desired radiation and absorption cross section. It has been found that $Zr^{4+}$ oxides provides good absorption of ultraviolet light at 193 nm wavelength and other far ultraviolet radiation. $Hf^{4+}$ oxides provide good absorption of electrons and extreme UV radiation. Further tuning of the composition for radiation absorption can be adjusted based on the addition of other metal ions. For example, one or more ions (cations or anions) comprising titanium, zinc, indium, tin, antimony, bismuth or combinations thereof can be added to the precursor solution to form a coating material with an absorption edge moved to longer wavelengths, to provide, for example, sensitivity to 248 nm wavelength ultraviolet light. Also, one or more ions (cations or anions) comprising magnesium, boron, calcium, aluminum, silicon, phosphorous or combinations thereof can be used to move the absorption edge to shorter wavelengths, limiting sensitivity to longer wavelengths as desired to limit out-of-band exposure with extreme UV sources.

The precursor solutions can also comprise polyatomic anions, which are generally oxygen based. The polyatomic anions can help to control gelation while still poising the solution toward the formation of a solid oxide when cured. Also, the polyatomic anions favor the formation of an amorphous solid structure upon further processing. The amorphous structure can improve surface smoothness as well as edge smoothness for patterned structures. Through the formation of an ultimate inorganic oxide, oxygen-based polyatomic anions can carry over into the oxide within an ultimate solid material. As with the cations, the nature of the anions can be pH dependent. Suitable oxygen-based polyatomic anions include, for example, $SO_4^{-2}$, $BO_3^{-3}$, $AsO_4^{-3}$, $MoO_4^{-2}$, $PO_4^{-3}$, $WO_4^{-2}$, $SeO_4^{-2}$, $SiO_4^{-4}$, their protonated forms, and combinations thereof. Generally, the precursor solution comprises a polyatomic anion concentration from about 0.1 to about 2.0 times the total metal cation concentration of the polyoxometal clusters, in other embodiments from about 0.5 to about 1.5 times the total metal cation concentration of the polyoxometal clusters, and in further embodiments from about 0.8 to about 1.3 times the total metal cation concentration of the polyoxometal clusters. A person of ordinary skill in the art will recognize that additional ranges of anion concentrations within the explicit ranges above are contemplated and are within the present disclosure. The polyatomic anions can be added as an acid if the pH adjustment is suitable, and/or the polyatomic anions can be added along with a desired metal cation. The precursor solution can generally be prepared with additional inorganic anions, such as nitrate and halide anions, which may be present with the metal cations of the polyoxometal clusters.

The peroxide-based anions and ligands can be used to stabilize the composition with respect to condensation. In particular, at high relative concentration of peroxide-based ligands, significant amounts of water can be removed from the composition without forming a condensed metal oxide or metal hydroxide. Based on the discovery of this stabilization property, solutions can be formed with high concentrations of peroxide-based anions and ligands that have good shelf stability while retaining convenient processing to form coatings. Halide anions introduced into a precursor solution may react with the peroxide ligands to form halogen molecules, such as $Cl_2$, $Br_2$ or $I_2$. The reaction with halide ions reduces the peroxide concentrations a corresponding amount relative to the added amounts of peroxide.

After the precursor solution is deposited as a coating, heat energy absorbed by the coating can be transferred to the peroxide ligand which can result in the rupturing of the peroxide bond and corresponding curing into the metal oxide material. The thermal control over the peroxide bond rupturing can provide control over the material properties. Specifically, as the peroxide groups are ruptured, the composition condenses with the formation of M-O-M bonds, where M represents a metal atom. Compositions with relatively high ligand concentrations can be highly stable with respect to the avoidance of spontaneous condensation.

The chemically simplest ligand composition would be hydrogen peroxide, $H_2O_2$, which is soluble in water. Additional peroxide-based ligands include, for example, organic compositions and/or inorganic compositions. In some embodiments, inorganic peroxide-based ligands can be desirable since carbon can be disadvantageous for many devices. If an inorganic peroxide is used as a ligand, the risk of carbon contamination from the radiation sensitive ligand is avoided. Suitable inorganic peroxide ligands include, for example, peroxysulfate ($SO_5H^-$), peroxydisulfate ($S_2O_8^{-2}$), peroxychlorates ($ClO_5H^-$), or the like or combinations thereof. The precursor composition generally comprises a ligand concentration of at least a factor of about 0.5 times the metal cation concentration, in further embodiments at least a factor of about 2, in other embodiments at least a factor of about 4 and in additional embodiments a factor from about 5 to about 25 times the metal cation concentration.

Peroxide-based ligands can also be ruptured with radiation, such as light or e-beam radiation. Thus, the condensation of the metal oxide material can be controlled with radiation rather than heat. The precursor solution can be dried into a solid with etching properties depending on the presence of the peroxide-based ligands. Based on the radiation curing of the material, the coating with peroxide-based ligands can be directly processible as an etch resist to take advantage of high etch differentiation based on whether or not the peroxide bonds have been ruptured. The use of these materials directly as an etch resist is described further in published U.S. patent application 2011/0293888 to Stowers et al., entitled "Patterned Inorganic Layers, Radiation Based Patterning Compositions and Corresponding Methods," incorporated herein by reference. Based on the thermal processing described herein, the materials can be formed into desirable very thin hardmasks with excellent etch contrast and convenient aqueous solution processing.

In general, the desired compounds are dissolved to form an aqueous solution. After the components of the solution are dissolved and combined, the character of the species may change as a result of hydration and, when relevant, peroxide-based ligand binding. When the composition of the precursor solution is referenced herein, the reference is to the components as added to the solution since the nature of the species in solution may not be well known.

In some embodiments, it may be desirable to form separate solutions that can be combined to form the precursor solution from the combination. Specifically, separate solutions can be formed comprising one or more of the following: the metal polyoxometal cluster cations, any additional metal cations, the optional peroxide-based anions and ligands and the polyatomic anions. If multiple metal cations are introduced, the multiple metal cations can be introduced into the same solution and/or in separate solutions. Generally, the separate solutions can be well mixed. In some embodiments, the metal cation solution is then mixed, for appropriate embodiments, with the peroxide-based ligand solution such that the peroxide-based ligand can conjugate with the metal cations. The resulting solution can be referred to as a stabilized metal cation solution. In some embodiments, the stabilized metal cation solution is allowed to stabilize for at least about five minutes and in further embodiments at least about 15 minutes prior to further processing. The polymeric anion solution can be added to the stabilized metal cation solution to form the stabilized precursor solution. This order of combining the solutions can lead to more desirable results in some embodiments of the precursor solution. The solutions can be combined under appropriate mixing conditions and at appropriate rates to achieve good mixing.

The concentrations of the species in the precursor solutions can be selected to achieve desired properties of the solution. In particular, lower concentrations overall can result in a desirable properties of the solution for certain coating approaches, such as spin coating, can achieve thinner coatings using reasonable coating parameters. In general, the concentration can be selected to be appropriate for the selected coating approach. As noted above, peroxide-based ligands can be used to greatly stabilize the precursor solutions. Stability of the precursor solutions can be evaluated with respect to changes relative to the initial solution. Specifically, a solution has lost stability if a phase separation occurs with the production of large sol particles. Some solutions, such as those producing aluminum phosphate masks appear to be stable for months, if not years even without the addition of stabilizing peroxide ligands. Based on the particular solution chemistry of the selected metals and anions and/or based on the stabilization approaches using peroxide-based anions and ligands, the solutions can be stable for at least about 2 hours without additional mixing, in further embodiments at least about 1 day, in other embodiments at least about 5 days and in additional embodiments at least about 30 days. A person of ordinary skill in the art will recognize that additional ranges of stabilization times are contemplated and are within the present disclosure. The solutions can be formulated with sufficient stabilization times that the solutions can be commercially distributed with appropriate shelf lives.

Desirable spin-coating solution viscosities can be selected with respect to the desired properties of the target coating, such as thickness. For some spin-coating embodiments, the precursor solution can have a viscosity from about 0.5 centipoise (cP) to about 150 cP, in further embodiments from about 1 to about 100 cP and in additional embodiments from about 2 cP to about 75 cP. A person of ordinary skill in the art will recognize that additional ranges of viscosity within the explicit ranges above are contemplated and are within the present disclosure.

Coating Material

A coating material is formed through the deposition of the precursor solution onto a selected substrate and condensation of the precursor solution into a solid complex metal oxide material, which also includes metal hydroxide oxide material. A substrate generally presents a surface onto which the coating material can be deposited, and the substrate structure may comprise a plurality of layers in which the surface relates to an upper most layer. The substrate surface can be treated to prepare the surface for adhesion of the coating material. As a part of the preparation of the surface, the surface can be cleaned and/or smoothed as appropriate. Suitable substrate surfaces can comprise any reasonable material. Some substrates of particular interest include, for example, silicon wafers, silica substrates, other inorganic materials, polymer substrates, such as organic polymers, composites thereof and combinations thereof in which a particular material can extend across a surface and/or in layers of the substrate. Wafers, such as relatively thin cylindrical structures, can be convenient, although any reasonable shaped structure can be used. Polymer substrates or substrates with polymer layers on non-polymer structures can be desirable for certain applications based on their low cost and flexibility, and suitable polymers can be selected based on the relatively low processing temperatures that can be used for the processing of the oxide hardmask materials described herein. Suitable polymers can include, for example, polycarbonates, polyimides, polyesters, polyalkenes, copolymers thereof and mixtures thereof. In general, it is desirable for the substrate to have a flat surface, especially for high resolution applications. Patterning of a substrate can comprise etching of the substrate and/or deposition in a pattern on the substrate.

Traditional organic resists are soluble in nonpolar solvents and are deposited onto hydrophobic surfaces. The surfaces can be treated with compounds, such as hexamethyldisilazane (HMDS), to render the surfaces hydrophobic and to promote adhesion of polymer resists. In contrast, the inorganic coating materials described herein are based on aqueous solutions, which suggests that it may be desirable to apply the solution to a hydrophilic surface for application to the substrate surface. Suitable methods can be used for particular substrate compositions to render the substrate hydrophilic, if the surface is not initially hydrophilic to a desired degree. For silicon substrates, a variety of methods can be used to render the surface hydrophilic including, but not limited to, soak in a basic detergent, oxygen plasma treatment, UV ozone treatment, soaking in a piranha etchant (3:1 mixture of concentrated $H_2SO_4$(aq) and 30% by weight $H_2O_2$(aq)), and treating with dimethylsulfoxide (DMSO) followed by heating at about 225° C. to about 275° C. for up to about 5 minutes.

In general, any suitable coating process can be used to deliver the precursor solution to a substrate. Suitable coating approaches can include, for example, spin coating, spray coating, dip coating, knife edge coating, capillary coating, printing approaches, such as inkjet printing and screen printing, and the like. Some of these coating approaches form patterns of coating material during the coating process, although the resolution available currently from printing or the like has a significantly lower level of resolution than available from radiation based patterning as described herein. The coating material can be applied in multiple coating steps to provide greater control over the coating process. For example, multiple spin coatings can be performed to yield an ultimate coating thickness desired. The heat processing described below can be applied after each coating step or after a plurality of coating steps.

Spin coating can be a desirable approach to cover the substrate relatively uniformly, although there can be edge effects. In some embodiments, a wafer can be spun at rates from about 500 rpm to about 10,000 rpm, in further embodiments from about 1000 rpm to about 7500 rpm and in additional embodiments from about 2000 rpm to about 6000 rpm. The spinning speed can be adjusted to obtain a desired coating thickness. The spin coating can be performed for times from about 5 seconds to about 5 minutes and in further embodiments from about 15 seconds to about 2 minutes. An initial low speed spin, e.g. at 50 rpm to 250 rpm, can be used to perform an initial bulk spreading of the composition across the substrate. A back side rinse, edge bead removal step or the like can be performed with water or other suitable rinse to remove any edge bead. A person of ordinary skill in the art will recognize that additional ranges of spin coating parameters within the explicit ranges above are contemplated and are within the present disclosure.

The thickness of the coating generally can be a function of the precursor solution concentration, viscosity and the spin speed. For other coating processes, the thickness can generally also be adjusted through the selection of the coating parameters. In some embodiments, it can be desirable to use a thin coating to facilitate formation of small and highly resolved features. In some embodiments, the coating materials can have an average thickness of no more than about 1 micron, in further embodiments no more than about 250 nanometers (nm), in additional embodiments from about 1 nanometers (nm) to about 50 nm, in other embodiments from about 1 nm to about 40 nm and in some embodiments from about 1 nm to about 25 nm. A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the film.

The coating process itself can result in the evaporation of a portion of the solvent since many coating processes form droplets or other forms of the coating material with larger surface areas and/or movement of the solution that stimulates evaporation. The loss of solvent tends to increase the viscosity of the coating material as the concentration of the species in the material increases. In general, the coating material can be heated in an initial step prior to further curing to drive off solvent and promote densification of the coating material.

An objective during the coating process can be to remove sufficient solvent to stabilize the coating material for further processing. The solvent removal process may not be quantitatively controlled with respect to specific amounts of solvent remaining in the coating material, and empirical evaluation of the resulting coating material properties generally can be performed to select processing conditions that are effective for the patterning process. While heating is not needed for successful application of the process, it can be desirable to heat the coated substrate to speed the drying process and/or to increase the reproducibility of the process. In embodiments in which heat is applied to remove solvent, the coating material can be heated to temperatures from about 45° C. to about 150° C., in further embodiments from about 50° C. to about 130° C. and in other embodiments from about 60° C. to about 110° C. The heating for solvent removal can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of heating temperature and times within the explicit ranges above are contemplated and are within the present disclosure.

After completion of a desired degree of drying, the coating materials can be heat treated in a post application bake (PAB) or hardbake to further condense the material and to further dehydrate the material. In particular, the PAB heat treatment coating material can be performed to provide desired levels of etch selectivity. In some embodiments, the patterned coating material can be heated to a temperature from about 150° C. to about 500° C., in further embodiments from about 175° C. to about 475° C. and in additional embodiments from about 200° C. to about 450° C. The heating can be performed for at least about 1 minute, in other embodiment for about 2 minutes to about 1 hour, in further embodiments from about 2.5 minutes to about 25 minutes. A person of ordinary skill in the art will recognize that additional ranges of temperatures and time for the heat treatment within the explicit ranges above are contemplated and are within the present disclosure.

Following baking and corresponding dehydration, the complex metal oxide coating material is formed, which can also refer to a material that is not absolutely dehydrated, i.e., a metal hydroxide oxide. The complex metal oxide material can be referred to by the equation $MO_xAn_y$, where M refers to one or more metal cations and "An" refers to the polyatomic anion that is incorporated into the product coating material. The x and y refer to the relative quantities of the species that carry over from the precursor solutions. The ratio of y divided by x (y/x) can be in some embodiments from about 0.5 to about 2.0, in further embodiments from about 0.75 to about 1.5 and in additional embodiments from about 0.8 to 1.3. A person of ordinary skill in the art will recognize that additional ranges of composition ratios within the explicit ranges above are contemplated and are within the present disclosure. Representative complex metal oxide materials exemplified below are $AlO_x(PO_4)_y$, $HfO_x(SO_4)_y$, and $Ti:ZrO_x(SO_4)_y$.

As noted above, ion exchange can be used to substitute all or a portion of the polyatomic anions with OH⁻ anions. Upon subsequent heating, the coating material forms a corresponding coating with reduced amounts of polyatomic anions or in the case where all of the polyatomic anions are removed, a simple metal oxide can be formed (e.g., $HfO_2$ or $Al_2O_3$). The modification of the coating composition to modify the anion composition can be used to tune the etch behavior, and may be useful to improve the etch contrast in some embodiments.

Photolithography Stack Structure and Processing

A stack structure is formed with the substrate to be patterned on the bottom, an etch resist on the top of the stack and one of more hardmask layers in which at least one of the hardmask layers is a complex metal oxide based coating as described herein. Suitable substrate materials are described above, and the structure of the substrate, such as thickness, surface area, shape and the like, are selected as suitable for the particular application. The substrate generally has a smooth surface or portion thereof that is used for the patterning described herein. While suitable resist layers can be organic radiation patternable resist materials, any suitable resist materials can be used that can benefit from the use of a hardmask. A plurality of hardmask layers can be used to provide a desired level of antireflective properties, etching selectivity and/or low substrate contamination. The hardmask layer(s) can have a composition selected to absorb the radiation for patterning the resist so that reflection is desirably reduced. The stack can then be sequentially etched top down to ultimately pattern the substrate in which the patterning can comprise etching and/or deposition along a selected pattern. Desired pattern resolution and aspect ratios can be achieved with the desired stack structures.

Suitable resist compositions can be organic resists, which generally comprise organic polymers. Organic resists can comprise, for example, poly(methyl methacrylate) (PMMA), poly(hydroxystyrene), poly(methyl glutarimide) (PMGI), a blend of phenol formaldehyde resin (novalac resin) with diazonaphthoquinone resin (DNQ), epoxy based resins, partially protected phenols typified by trade-name resists KRS™ and APEX™, acrylate/methacrylate copolymers, hybrid aliphatic/phenolic structures typified by trade-name resist ESCAP™, epoxy-based resins (e.g., SU-8), a combination thereof or the like. Suitable resists can be positive resist or negative resists. To obtain desired degrees of resolution in the pattern, the resist layers generally are formed to be thin. In some embodiments, the resist layers have an average thickness from about 10 nm to about 1 micron, in further embodiments from about 20 nm to about 500 microns and in additional embodiments from about 30 nm to about 200 nm. A person of ordinary skill in the art will recognize that additional ranges within the explicit ranges above are contemplated and are within the present disclosure.

With respect to the solution processible complex metal oxide hardmasks materials described herein, the resulting hardmask layer is deposited and cured as described above.

The resulting coating can be very smooth and thin. The cured coating comprises a metal oxide material that presumably maintains structural features relating to the polyatomic anions embedded within the structure and the precise atomic structure may not be readily ascertainable. As used herein, the term "complex" in reference to the metal oxide refers to presumed structural features in the product solid material relating to the polyatomic anions as well as the metal cations. However, as described below, the material has an etching property associated generally with metal oxides. The hardmask layer can have an average thickness from about 1 nm to about 50 nm, in further embodiments from about 2 nm to about 30 nm and in additional embodiments from about 2.5 nm to about 20 nm. A person or ordinary skill in the art will recognize that additional ranges within the explicit thickness ranges above are contemplated and are within the present disclosure.

As noted above, additional hardmask and/or antireflective layers can be incorporated into the structure to provide for improved antireflective properties and/or to introduce additional desired etch contrast for the overall stack. The selection of one or more additional hardmask layers can be based on composition of the substrate and can be selected based on compatibility with the other materials. In general, the order of the metal oxide hardmask and the additional hardmask layers can be selected as convenient for etching purposes. Thus, the metal oxide based hardmask can be placed adjacent the substrate surface, adjacent the resist or sandwiched between additional hardmask layers. Suitable additional hardmask layers can include, for example, silicon nitride ($Si_3N_4$ or $Si_xN_yH_z$), silicon oxynitride ($Si_xO_yN_z$) or amorphous carbon. The additional hardmask layers can be deposited using chemical vapor deposition, such as PECVD, or other suitable techniques. Generally, an additional hardmask/antireflective coating layer can have an average thickness from about 5 nm to about 1 micron, in further embodiments from about 15 nm to about 800 nm and in additional embodiments from about 20 nm to about 700 nm. The selection of the thickness can depend significantly on the composition. For example in some embodiments, an amorphous carbon coating can have an average thickness from about 100 nm to about 500 nm, and a silicon nitride layer can have an average thickness from about 15 nm to about 100 nm. A person of ordinary skill in the art will recognize that additional ranges of average thickness within the explicit ranges above are contemplated and are within the present disclosure.

Figure 2:
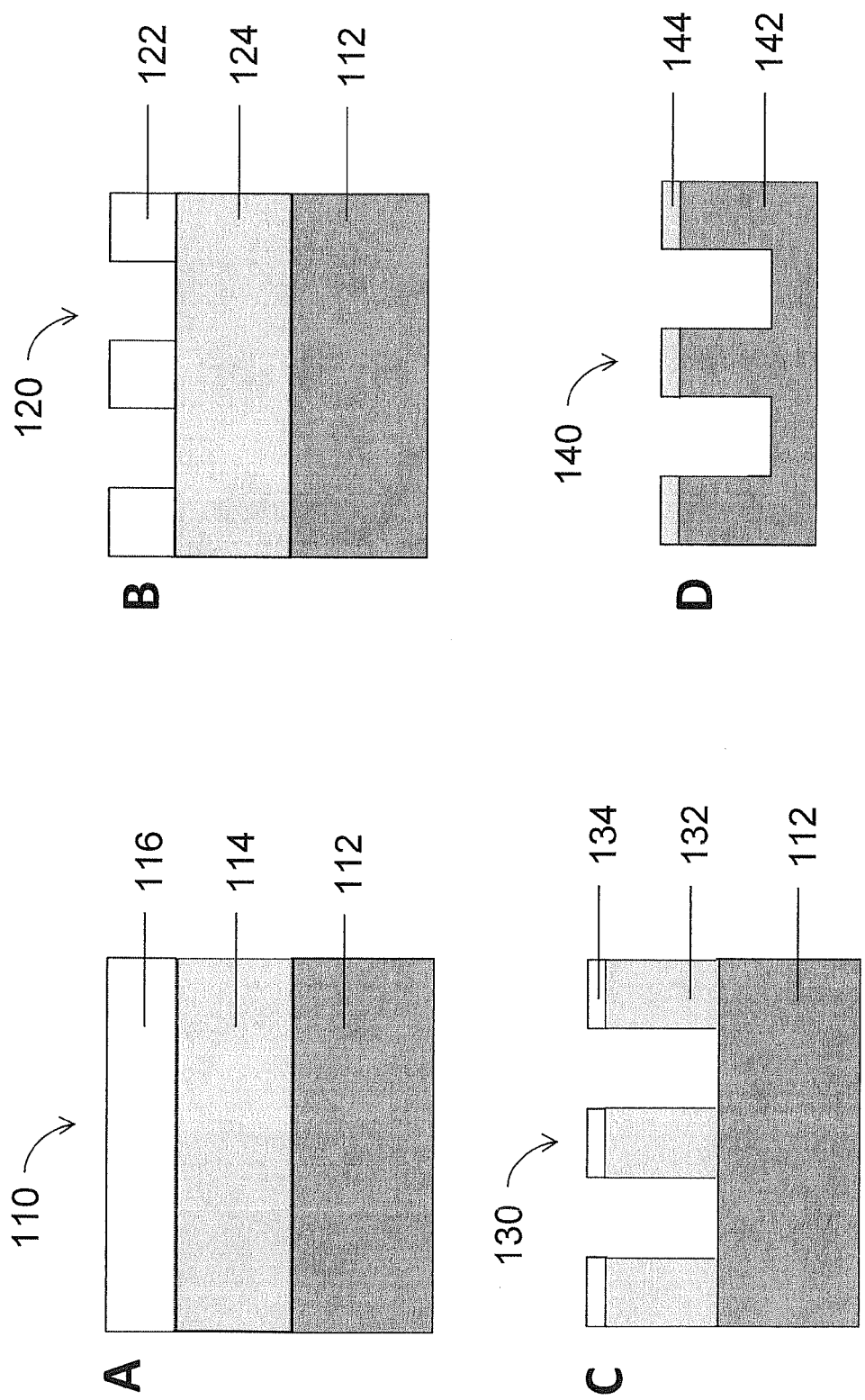
FIG. 2A is a schematic cross sectional view of a substrate with a metal oxide based hardmask layer covered with a radiation patternable polymer resist.
FIG. 2B is a schematic cross sectional view of the structure of FIG. 2A with the polymer resist patterned and developed.
FIG. 2C is a schematic cross sectional view of the structure of FIG. 2B further etched through the hardmask layer.
FIG. 2D is a schematic cross sectional view of the structure of FIG. 2C further etched into the substrate.

Patterning a layered stack with the solution processible complex metal oxide hardmask as the sole hardmask intermediate layer is schematically shown in FIGS. 2A-2D. Referring to FIG. 2A, the initial stack 110 comprises a substrate 112 with a hardmask 114 on the surface of substrate 112 and a radiation patternable resist layer 116 on the top of the stack above the hardmask. After an initial etch step, an etched stack 120 comprises an etched or developed resist layer 122. As shown in FIG. 2B, the hardmask layer 124 may be substantially unaffected, although some limited etching may take place dependent upon the etch contrast between the resist and the hardmask. Substrate 112 may be essentially unchanged after this initial etch. The hardmask can then be etched using the image formed in the resist, as shown in FIG. 2C, to form further patterned stack 130. Patterned hardmask 132 has a pattern corresponding to resist 134, which can be further removed during the hardmask etch. Substrate 112 may be slightly etched during the etching of hardmask 132. Based on the pattern in the hardmask, the substrate can be etched to form a patterned structure 140. Patterned structure 140 comprises patterned substrate 142 and patterned hardmask 144, which may be partially removed from the etching as shown in FIG. 2D. The resist may or may not be completely removed following the etching of the substrate, although FIG. 2D shows the more likely result that the resist is removed. At the end of the patterning of the substrate, some of the hardmask may or may not remain. As noted above, patterning of the substrate can comprise etching and/or deposition along a pattern, although FIG. 2D only depicts the etching embodiment. The remaining hardmask material 144 can be removed using a suitable etching agent for further processing of the substrate.

Figure 3:
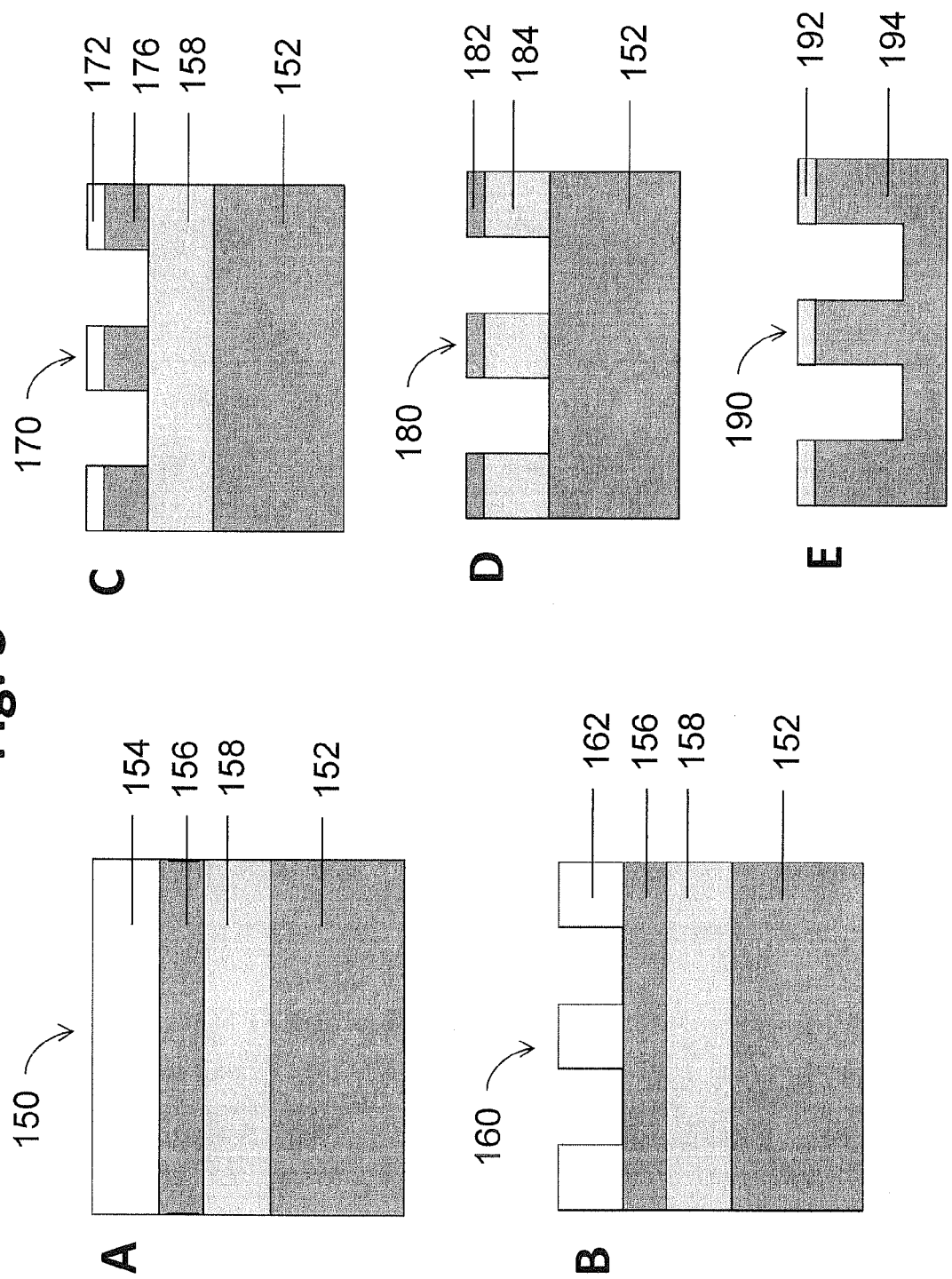
FIG. 3A is a schematic cross sectional view of a substrate with a first hardmask layer and a metal oxide based hardmask layer covered with a radiation patternable polymer resist.
FIG. 3B is a schematic cross sectional view of the structure of FIG. 3A with the polymer resist patterned and developed.
FIG. 3C is a schematic cross sectional view of the structure of FIG. 3B further etched through the metal oxide hardmask layer.
FIG. 3D is a schematic cross sectional view of the structure of FIG. 3C further etched through the lower hardmask layer.
FIG. 3E is a schematic cross sectional view of the structure of FIG. 3D further etched into the substrate.

Referring to FIGS. 3A-3E, the processing of a stack structure is depicted for a layered stack with two hardmask layers. Referring to FIG. 3A, lithography stack 150 comprises a substrate 152, radiation patternable resist layer 154 at the top and hardmask layers 156, and 158 between substrate 152 and resist layer 154. At least one of the hardmask layers 156, 158 comprises the solution processible complex metal oxide materials described herein. The resist layer can be irradiated to form a latent image that can then be contacted with a developer to form stack 160 with a physically patterned resist layer 162, as shown in FIG. 3B. Hardmask layer 156 may be slightly etched during patterning of resist layer 162, while hardmask layer 158 and substrate 152 are generally unaffected at this stage of processing. The patterning of hardmask layer 176 is shown in FIG. 3C to produce an etched stack 170. The etching to produce etched hardmask layer 172 is based on the pattern of developed resist layer 162 of FIG. 3B. The resist pattern may be etched completely, or in part during this process to form layer 172. Some portion of the lower hardmask layer can be somewhat etched during this process. The lower hardmask layer can then be patterned to form structure 180 as shown in FIG. 3D. The lower hardmask layer can be etched according to the pattern of the upper hardmask layer to form patterned layer 184. The patterned upper hardmask layer may be partially removed while etching the lower hardmask layer to form the layer 182 of FIG. 3D, and the resist material may be fully removed at this stage of processing, although generally some of the upper hardmask layer remains. The substrate may be slightly etched in structure 180. Then, the substrate can be patterned, i.e., etched and/or deposited with material, based on the pattern of hardmask layer 184 to form patterned structure 190 as shown in FIG. 3E, although an etched embodiment of the substrate is shown. Patterned substrate 194 is generally patterned according to the pattern of the lower hardmask layer 192, which may be partially removed while etching the substrate. A portion of lower hardmask layer 192 generally remains after patterning the substrate. Remaining hardmask layer 192 can then be removed if desired to leave the etched substrate.

In some embodiments, the developer for the resist is an aqueous base, such as 2.38 weight percent tetramethyl ammonium hydroxide (TMAH), or as specified by the resist manufacturer.

After development of the resist, the complex metal oxide layers described herein can be etched by either wet or dry processes. Generally, these etch processes are similar to etch processes developed for metal oxides formed by conventional vapor deposition.

Wet etching of the metal oxide layers described herein can be performed with aqueous acids or bases. Acids may include, but are not limited to, complexing organic acids such as oxalic acid or formic acid, or inorganic acids such as nitric, phosphoric or hydrochloric acid.

To reduce contamination from the etchant, it can be desirable to use an etchant that does not have metal atoms. Thus, desirable base etchants include quaternary ammonium hydroxide compositions, such as tetraethylammonium hydroxide, tetrapropylammonium hydroxide, tetrabutylammonium hydroxide or combinations thereof. In general, the quaternary ammonium hydroxides of particular interest can be represented with the formula $R_4NOH$, where R=a methyl group, an ethyl group, a propyl group, a butyl group, or combinations thereof. Some of the inorganic coating materials described herein can be etched with the same developer commonly used presently for polymer resists, specifically tetramethyl ammonium hydroxide (TMAH). In such cases, the complex metal oxide hardmasks can be etched in the same process step as the resist develop. This is commonly known as a D-BARC or "developable bottom antireflective coating". In general, such an etchant can comprise from about 2 to about 40 weight percent, in further embodiments from about 3 to about 35 weight percent and in other embodiments from about 4 to about 30 weight percent tetra-alkylammonium hydroxide. A person of ordinary skill in the art will recognize that additional ranges of developer concentrations within the explicit ranges above are contemplated and are within the present disclosure.

In addition to the primary etchant composition, an etchant can comprise additional compositions to facilitate the etching process. Suitable additives include, for example, dissolved salts with cations selected from the group consisting of ammonium, d-block metal cations (hafnium, zirconium, lanthanum, or the like), f-block metal cations (cerium, lutetium or the like), p-block metal cations (aluminum, tin, or the like), alkali metals (lithium, sodium, potassium or the like), and combinations thereof, and with anions selected from the group consisting of fluoride, chloride, bromide, iodide, nitrate, sulfate, phosphate, silicate, borate, peroxide, butoxide, formate, ethylenediamine-tetraacetic acid (EDTA), tungstate, molybdate, or the like and combinations thereof. If the optional additives are present, the etchant can comprise no more than about 10 weight percent additive and in further embodiments no more than about 5 weight percent additive. A person of ordinary skill in the art will recognize that additional ranges of additive concentrations within the explicit ranges above are contemplated and are within the present disclosure. The additives can be selected to improve differential etching, line width roughness, and to inhibit formation and precipitation of metal oxide particles.

A wet etchant can be applied to the structure using any reasonable approach. For example, the etchant can be sprayed onto the structure. Also, spin coating can be used. For automated processing, a puddle method can be used involving the pouring of the etchant onto the coating material in a stationary format. If desired spin rinsing and/or drying can be used to complete the etching process. Suitable rinsing solutions include, for example, ultrapure water, methyl alcohol, ethyl alcohol, propyl alcohol and combinations thereof. Wet etching can also be performed by conventional dip methods. A person of ordinary skill in the art will recognize that additional wet etch chemistries and methods of contacting the structure to the etchant are contemplated and are within the present disclosure.

In addition to wet etching to develop the pattern, dry etching with a plasma can be used alternatively or additionally with respect to the wet etching. Plasma etching can comprise delivery of reactive atomic or ionic species within a plasma system, which can comprise an RF generator or the like to generate the plasma. Plasma etching systems are known in the art, and a wide range of vapor species can be delivered into the plasma to facilitate the etching and/or to achieve desired etching contrast for different materials. Suitable plasma species include, for example, He, Ar, $O_2$, $N_2$, fluorocarbons, such as $CHF_3$, $BCl_3$, $Cl_2$, combinations thereof and the like.

With organic resists, structures are susceptible to pattern collapse if the aspect ratio, height divided by width, of a structure becomes too large. Pattern collapse can be associated with mechanical instability of a high aspect ratio structure such that forces, e.g., surface tension, associated with processing steps distorting the structural elements. Low aspect ratio structures are more stable with respect to potential distorting forces. Thus, a thinner polymer resist layer is used in the structures described herein, and one or more hardmask layers are used to provide much higher etch contrast with respect to the substrate or intervening layers than is possible from a polymer resist. With the metal suboxide hardmask materials described herein, due to the ability to process effectively the structures with thinner layers of coating material, improved patterning can be accomplished without the need for high aspect ratio patterned coating material. Thus, very high resolution features have been formed without resorting to high aspect ratio features in the patterned coating material.

In some embodiments, it is desirable for the hardmask to exhibit good etch contrast with other materials to be patterned to provide for a desired level of avoidance of pattern collapse and to be able to process relatively high aspect ratio features. The etch contrast between different materials can be evaluated through a comparison of the etch rates. In some embodiments, the ratio of etch rates can be at least a factor of about 5, in further embodiments at least a factor of about 7, in additional embodiments at least a factor of about 10 and in other embodiments from a factor of about 25 to a factor of about 1000 or greater. A person of ordinary skill in the art will recognize that additional ranges of etch rate ratios within the explicit rates above are contemplated and are within the present disclosure. As demonstrated in the examples below, the complex metal oxide hardmasks can be etched under appropriate etch conditions to achieve an appropriate etch ratio for a wide range of materials that can be incorporated into the processing described herein.

Based on the patterning approaches described herein, the resulting structures can have sharp edges with very low linewidth roughness. In particular, in addition to the ability to reduce line-width roughness, the high contrast also allows for the formation of small features and spaces between features as well as the ability to form very well resolved two-dimensional patterns (e.g., sharp corners).

Alternatively or additionally, the deposition of a further material can alter the properties of the underlying structure and/or provide contact to the underlying structure. The further coating material can be selected based on the desired properties of the material. In addition, ions can be selectively implanted into the underlying structure, as the density of the patterned inorganic coating material can provide a high implant resistance. In some embodiments, the further deposited material can be a dielectric, a semiconductor, a conductor or other suitable material. The further deposited material can be deposited using suitable approaches, such as solution based approaches, chemical vapor deposition (CVD), sputtering, physical vapor deposition (PVD), or other suitable approach.

EXAMPLES

Example 1

Preparation of Metal Oxide Materials

This example describes a method that has been used to prepare metal oxide precursor solutions comprising polyoxometal clusters based on hafnium (Hf), zirconium (Zr), aluminum (Al), tungsten (W), and titanium (Ti).

Metal-containing aqueous solutions were filtered and diluted before combining with diluted polyatomic anion solutions such as dilute $H_2SO_4$ solutions with optional addition of diluted $H_2O_2$ to form polyoxometal solutions with the concentration of specific components specified below. A photo of a representative metal oxide precursor solution is shown in FIG. 4, indicating the formation of a transparent clear solution.

$AlO_x(PO_4)_y$: 0.56 M $AlO^+$, 0.34 M $PO_4^{2-}$;
$HfO_x(SO_4)_y$: 0.4 M $HfO^+$, about 0.26 M $SO_4^{2-}$, and 1.2 M $H_2O_2$
Ti:$ZrO_x(SO_4)_y$: 0.25 M $TiO^+$, 0.25 M $ZrO^+$, 1.5 M $H_2O_2$, and about 0.4 M $SO_4^{2-}$
W:$HfO_x(SO_4)_y$: 0.2 M $HfO^+$, 0.04M $WO_4^{2-}$, 0.6 M $H_2O_2$, and about 0.13 M $SO_4^{2-}$ The polyoxometal solutions were then used to form metal oxide hardmask films. The films have little contamination with critical impurity levels generally less than 50 ppb as specified in Table 1 below.

TABLE 1

| Element | Ag | Au | Co | Cu | Fe | Li | Mn | Ni | Pd | Pt | Ru | Zn |
|---|---|---|---|---|---|---|---|---|---|---|---|---|
| Impurity (ppb) | <20 | <5 | <5 | <20 | <5 | <20 | <50 | <5 | <50 | <5 | <50 | <5 |

Example 2

The Optical and Dielectric Properties of the Metal Oxide Hardmask

Figure 5A:
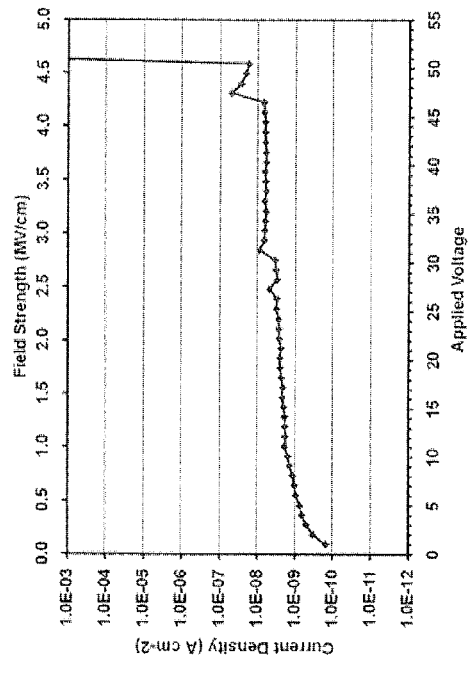
FIG. 5A is a plot of refractive index n and the extinction coefficient k of AlO—($PO_4$) at different wavelengths.
Figure 5B:
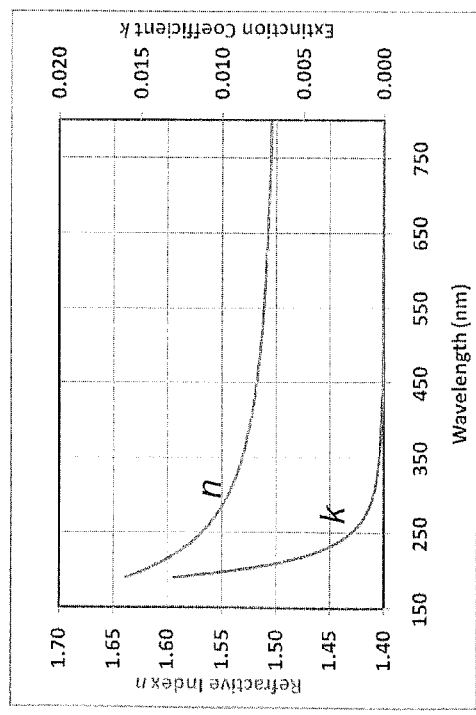
FIG. 5B is a plot of current density versus field strength and applied voltage of $AlO_x(PO_4)_y$.

The optical and dielectric properties of the metal oxide materials formed in Example 1 were evaluated. Specifically, a precursor from the aluminum oxide phosphate $AlO_x(PO_4)_y$ family described in example 1 was spin-coated onto a Mo film to form a coating layer (also referred to as film) with a thickness of 110 nm. The aluminum oxide phosphate layer was cured at 350° C. although a process temperature in the range of 300 to 1000° C. can be used to make film or layer with a thickness of <5 nm to 200 nm. Capacitor structures of area 1.1 $mm^2$ were then formed by evaporating an array of Al dots onto the aluminum oxide phosphate layer. The optical properties of the film such as refractive index n and the extinction coefficient k of at different wavelength were extracted using a J.A. Woollam VASE ellipsometer and the results are shown in FIG. 5A. The dielectric properties of the film were extracted from MIM capacitor I-V/C-V data and shown in FIG. 5B. The optical and dielectric properties of the films are further summarized in Table 2 below indicating a relative dielectric constant at 1 kHz of 4.9 and refractive index at 193 nm of 1.63. The accessible range is the estimated range of parameters that can be reached with the hardmask materials described herein.

TABLE 2

| Film Parameters | Breakdown Field (MV/cm) | Leakage Current @ 1 MV $cm^{-2}$ (nA $cm^{-2}$) | Relative Dielectric Constant@1 kHz | Loss Tangent@ 1 kHz (%) | Index of Refraction @ 193 nm |
|---|---|---|---|---|---|
| $AlO_x(PO_4)_y$ | 4.7 | 1.5 | 4.9 | 0.1 | 1.63 |
| Accessible Range | 4-7 | 0.5-5 | 4.6-7 | 0.1-1 | 1.6-1.9 |

Figure 6A:
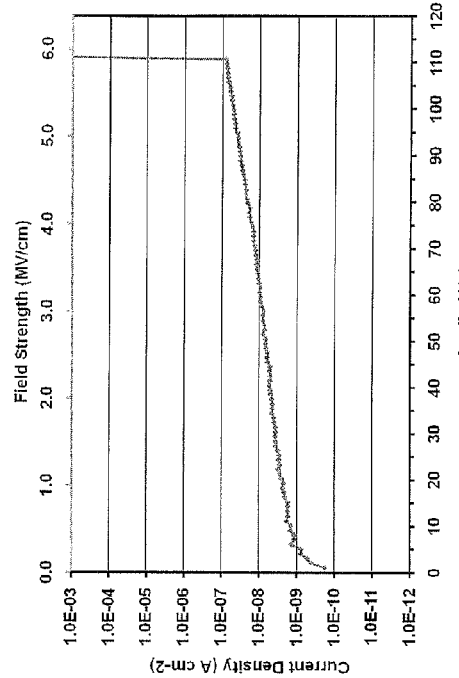
FIG. 6A is a plot of refractive index n and the extinction coefficient k of HfO—(SO$_4$) at different wavelength.
Figure 6B:
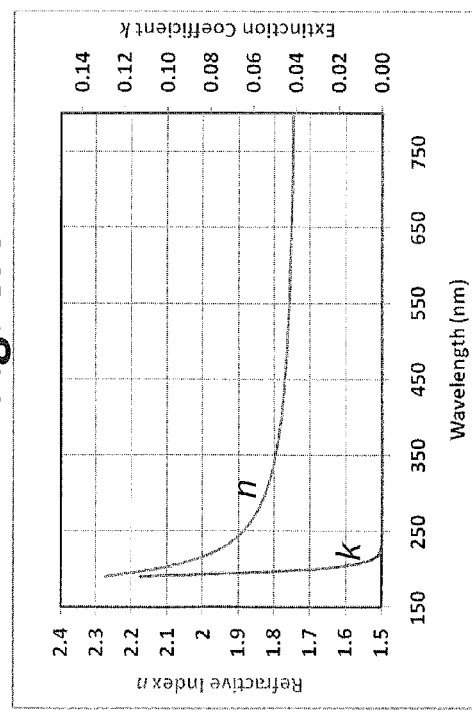
FIG. 6B is a plot of current density versus field strength and applied voltage of HfO—(SO$_4$).

A precursor from the hafnium oxide sulfate $HfO_x(SO_4)_y$ family described in example 1 was spin coated onto a Ta film to form a metal oxide film with a thickness of 180 nm. The hafnium oxide sulfate film was cured at 350° C. although a process temperature in the range of 300 to 1000° C. can be used to make the film with a thickness of <5 nm to 200 nm. Capacitor structures of area 1.1 $mm^2$ were formed by evaporating an array of Al dots onto the metal oxide film. The optical properties of the film such as refractive index n and the extinction coefficient k at different wavelengths were extracted using a J.A. Woollam VASE ellipsometer, and the results are shown in FIG. 6A. The dielectric properties of the film were extracted from MIM capacitor I-V/C-V data, and they are summarized in FIG. 6B. The optical and dielectric properties of the films are further summarized in Table 3 below indicating a relative dielectric constant at 1 kHz of 8.2 and refractive index at 193 nm of 2.27. The accessible range is the estimated range of parameters that can be reached with the specified material within the bounds of solution and film chemistry.

TABLE 3

| Film Parameters | Breakdown Field (MV/cm) | Leakage Current @ 1 MV $cm^{-2}$ (nA $cm^{-2}$) | Relative Dielectric Constant@1 kHz | Loss Tangent@ 1 kHz (%) | Index of Refraction @ 193 nm |
|---|---|---|---|---|---|
| $HfO_x(SO_4)_y$ | 5.9 | 2.3 | 8.2 | 1.1 | 2.27 |
| Accessible Range | 4-7 | 1-5 | 8-10 | 1-2 | 2.0-2.5 |

Example 3

Compatibility Studies of Metal Oxide Material on Various Substrate Surfaces

This example describes compatibility studies of the deposited materials on various substrate surfaces to determine the appropriate pre-treatment conditions to render the substrate surfaces hydrophilic and suitable for metal oxide coating. The polyoxometal precursors were made using the procedure outlined in Example 1.

Spin on carbon (SoC) hardmasks and silicon based antireflection coatings (Si-ARC) or layers on silicon wafers have been used as substrate surfaces. The Si-ARC and SoC materials are commercially available, and while used here for illustrative purposes, may not be representative of other materials with the same general function. The Si-ARC refers to a polymer containing Si with organic units or halide bound to the silicon, which are generally polysiloxanes. The Si-ARC coating on silicon wafer had a thickness of about 30 nm, comprises >30% silicon and was subjected to a 220° C., 60 s post application bake (PAB). The SoC coating (high carbon content polymer) on a silicon wafer had a thickness of about 180 nm, comprises >50% C, and was subjected to a 250° C. 60 s PAB. The substrate surfaces were pretreated with heating, $O_2$ plasma, ultraviolet ozone (UVO), piranha immersion, or SC-1 immersion to render the substrate surfaces hydrophilic. Piranha etch includes 3:1 (vol) conc. of $H_2SO_4$: $H_2O_2$. SC-1 includes 1:1:5 (vol) conc. $NH_4OH:H_2O_2:H_2O$. Solutions of the metal oxides were then applied on the substrate surface to observe the effect of the metal oxide on the surface.

Pre-Treatment of SoC Wafer Surfaces

The effect of polyoxometal precursor solutions on the surface of a typical SoC film was studied. Specifically, the polyoxometal precursor solutions were applied on the surface of silicon wafers having SoC film for 30 s, 1 min, 5 min and the results observed under an optical microscope are listed in table 4 below. Although the $HfO_x(SO_4)_y$ solution and $Ti:ZrO_x(SO_4)_y$ solution appeared to leave residue on bare Si, no obvious etching of the SoC film was observed. The area covered with polyoxometal solutions seems to be more hydrophilic than initial substrate surface independent of observable residue from rinse.

TABLE 4

| Observation on SoC Film | | $AlO_x(PO_4)_y$ | $HfO_x(SO_4)_y$ | $Ti: ZrO_x(SO_4)_y$ | $H_2O$ |
|---|---|---|---|---|---|
| 30 s | Reaction | No Effect | No Effect | No Effect | No Effect |
| | Wetting | Poor | Poor | Poor | Poor |
| 1 min | Reaction | No Effect | bubbles, light residue | No Effect | No Effect |
| | Wetting | Poor | Poor | Poor | Poor |
| 5 min | Reaction | No Effect | bubbles, light residue | bubbles, light residue/ring | No Effect |
| | Wetting | Poor | Poor | Poor | Poor |

The effect of polyoxometal solutions on the surface of the SoC (the film) pretreated with heating has been studied. Specifically, the silicon wafers coated with SoC films have been heated at the 300 or 350 degree Celsius in air for 10 mins followed by application of the polyoxometal solution on the SoC wafer surface. After 1 min of polyoxometal solution application, the observed effects on the surface of the SoC wafer have been recorded and listed in table 5 below. The 350 degree Celsius heat treatment appears to provide good hydrophilic properties to the treated surface although significant thickness reduction of the SoC film was observed. The heating method therefore does not appear to be appropriate to treat the SoC wafer.

TABLE 5

| Treatment | Observed Effect | | $AlO_x(PO_4)_y$ | $HfO_x(SO_4)_y$ | $Ti: ZrO_x(SO_4)_y$ | $H_2O$ |
|---|---|---|---|---|---|---|
| 300° C. | Thickness Reduction | Reaction | No Effect | bubbles, residue/ring | bubbles, residue/ring | No Effect |
| | | Wetting | Poor | Poor | Poor | Poor |
| 350° C. | Significant Thickness Reduction | Reaction | No Effect | bubbles, residue/ring | bubbles, residue/ring | No Effect |
| | | Wetting | OK | OK | OK | OK |

The effect of polyoxometal solution on the surface of SoC film pretreated with UVO has been studied. Specifically, the silicon wafers having SoC film have been pretreated with UVO for 5 min with or without subsequent water rinse. The polyoxometal solutions were then applied on the UVO treated SoC wafer surface. About 1 min after application of polyoxometal solution, the observed effects on the surface of the SoC wafer have been recorded and listed in table 6 below. The UVO treated SoC wafer appears to have good wetting properties for all the polyoxometal solutions tested without observable effect on the SoC film. UVO therefore appears to be a good pre-treatment method for the SoC films.

TABLE 6

| Treatment | Observed Effect | | $AlO_x(PO_4)_y$ | $HfO_x(SO_4)_y$ | Ti: $ZrO_x(SO_4)_y$ | $H_2O$ |
|---|---|---|---|---|---|---|
| UVO | None | Reaction | No Effect | bubbles, light residue/ring | bubbles, light residue/ring | No Effect |
| | | Wetting | Good | Good | Good | Good |
| UVO + $H_2O$ rinse | None | Reaction | No Effect | bubbles, light residue/ring | bubbles, light residue/ring | No Effect |
| | | Wetting | OK | Good | Good | Good |

The effect of polyoxometal solution on the surface of a SoC film pretreated with Piranha immersion, SC-1 immersion, and Oxygen plasma has been studied. Specifically, the silicon wafers having SoC film have been immersed in Piranha or SC-1 for 30 seconds at room temperature (RT) or exposed to oxygen plasma for 5 min. The polyoxometal solutions were then applied on the treated SoC wafer surfaces. About 1 min after application of the polyoxometal solution, the observed effects on the surfaces of the SoC wafers have been recorded and listed in table 7 below. Significant etching of the wafers was observed. The Piranha, SC-1 and oxygen plasma treatments therefore appear to be unsuitable pre-treatment methods for the SoC films.

TABLE 7

| Treatment | Observed Effect | | $AlO_x(PO_4)_y$ | $HfO_x(SO_4)_y$ | Ti: $ZrO_x(SO_4)_y$ | $H_2O$ |
|---|---|---|---|---|---|---|
| Piranha (RT) Immersion 30 s | Rapid/ Complete Etch | | Underlying Si/wafer backside hydrophilic | | | |
| SC-1 (RT) Immersion 30 s | Rapid Skin/ Delamination | | Underlying Si/wafer backside hydrophilic | | | |
| $O_2$ Plasma, 5 min | Sig. Etching | Reaction? | No Effect | bubbles, residue/ring | bubbles, residue/ring | No Effect |
| | | Wetting? | Good | Good | Good | Good |

Pre-Treatment of Si-ARC Wafer Surfaces

The effect of polyoxometal solutions on the surface of Si-ARC has been studied. Specifically, the solutions of the polyoxometals were applied on the surface of silicon wafers coated with a Si-ARC film and then observed at 30 s, 1 min, 5 min. The results are listed in table 8 below. No wetting or etching of the Si-ARC has been observed.

TABLE 8

| | Effect | $AlO_x(PO_4)_y$ | $HfO_x(SO_4)_y$ | Ti: $ZrO_x(SO_4)_y$ | $H_2O$ |
|---|---|---|---|---|---|
| 30 s | Reaction | No Effect | No Effect | No Effect | No Effect |
| | Wetting | Very Poor | Very Poor | Very Poor | Very Poor |
| 1 min | Reaction | No Effect | No Effect | No Effect | No Effect |
| | Wetting | Very Poor | Very Poor | Very Poor | Very Poor |
| 5 min | Reaction | No Effect | No Effect | No Effect | No Effect |
| | Wetting | Very Poor | Very Poor | Very Poor | Very Poor |

The effect of the polyoxometal solution on the surface of Si-ARC pretreated with heating has been studied. Specifically, the silicon wafers having Si-ARC film have been heated at the 300 or 350 degree Celsius in air for 10 mins followed by application of the polyoxometal solution on the Si-ARC wafer surface. About 1 min after application of the polyoxometal solution, the observed effects on the surface of the Si-ARC wafer have been recorded and listed in table 9 below. The heat treatments do not appear to provide hydrophilic properties to the treated Si-ARC surface, although the Si-ARC appears to be stable under the specified heating conditions.

TABLE 9

| Treatment | Observed Effect | | $AlO_x(PO_4)_y$ | $HfO_x(SO_4)_y$ | Ti: $ZrO_x(SO_4)_y$ | $H_2O$ |
|---|---|---|---|---|---|---|
| 300° C. | None | Reaction | No Effect | No Effect | No Effect | No Effect |
|  |  | Wetting | Very Poor | Very Poor | Very Poor | Very Poor |
| 350° C. | None | Reaction | No Effect | No Effect | No Effect | No Effect |
|  |  | Wetting | Poor | Poor | Poor | Poor |

The effect of polyoxometal solutions on the surface of the Si-ARC film pretreated with UVO has been studied. Specifically, the silicon wafers having Si-ARC film have been pretreated with UVO for 5 min with or without subsequent water rinse. The polyoxometal solutions were then applied on the UVO treated Si-ARC wafer surface. About 1 min after application of the polyoxometal solution, the observed effects on the surface of the Si-ARC wafer have been recorded and listed in table 10 below. The UVO treated Si-ARC wafer appears to have good wetting properties for all of the polyoxometal solutions tested without observable effect on the Si-ARC film. UVO therefore appears to be a good pre-treatment method for the Si-ARC wafer.

TABLE 10

| Treatment | Observed Effect | | $AlO_x(PO_4)_y$ | $HfO_x(SO_4)_y$ | Ti: $ZrO_x(SO_4)_y$ | $H_2O$ |
|---|---|---|---|---|---|---|
| 5 min UVO | None | Reaction | No Effect | No Effect | No Effect | No Effect |
|  |  | Wetting | Good | Good | Good | Good |
| 5 min UVO + $H_2O$ rinse | None | Reaction | No Effect | No Effect | No Effect | No Effect |
|  |  | Wetting | OK | Good | Good | Good |

The effect of polyoxometal solutions on the surfaces of Si-ARC pretreated with Piranha immersion, SC-1 immersion, and Oxygen plasma has been studied. Specifically, the silicon wafers coated with Si-ARC films have been immersed in Piranha or SC-1 for 30 seconds, 5 min or 30 min at room temperature (RT) or exposed to oxygen plasma for 5 min. The polyoxometal solutions were then applied onto the treated Si-ARC wafer surfaces. About 1 min after application of the polyoxometal solution, the observed effects on the surfaces of the Si-ARC wafers have been recorded and listed in table 11 below. Both SC-1 and Piranha immersion appeared to nucleate static bubbles on the Si-ARC, with no obvious changes in the Si-ARC observed up to 30 min immersion. Although oxygen plasma treatment appeared to improve the wetting abilities of the Si-ARC wafer, some etching of the wafer, however, was observed. The Piranha, SC-1 and oxygen plasma treatments therefore appear to be unsuitable pre-treatment methods for the Si-ARC coating tested here.

TABLE 11

| Treatment | Observed Effect | | $AlO_x(PO_4)_y$ | $HfO_x(SO_4)_y$ | Ti: $ZrO_x(SO_4)_y$ | $H_2O$ |
|---|---|---|---|---|---|---|
| Piranha (RT) Immersion 30 s | None | Reaction | No Effect | No Effect | No Effect | No Effect |
|  |  | Wetting | Poor | Poor | Poor | Poor |
| Piranha (RT) Immersion 5 min | None | Reaction | No Effect | No Effect | No Effect | No Effect |
|  |  | Wetting | OK | Poor | Poor | OK |
| Piranha (RT) Immersion 30 min | None | Reaction | No Effect | No Effect | No Effect | No Effect |
|  |  | Wetting | OK | Poor | Poor | OK |
| SC-1 (RT) Immersion 30 s | None | Reaction | No Effect | No Effect | No Effect | No Effect |
|  |  | Wetting | Poor | Poor | Poor | Poor |
| SC-1 (RT) | None | Reaction | No Effect | No Effect | No Effect | No Effect |

TABLE 11-continued

| Treatment | Observed Effect | | $AlO_x(PO_4)_y$ | $HfO_x(SO_4)_y$ | Ti: $ZrO_x(SO_4)_y$ | $H_2O$ |
|---|---|---|---|---|---|---|
| Immersion 5 min SC-1 (RT) | None | Wetting Reaction | Poor No Effect | Poor No Effect | Poor No Effect | Poor No Effect |
| Immersion 30 min $O_2$ Plasma, 5 min | Some Etching | Wetting Reaction Wetting | Poor No Effect Good | Poor No Effect Good | Poor No Effect Good | Poor No Effect Good |

In general, a 5 min UVO treatment was found to make these SoC/Si-ARC film stacks hydrophilic. No macroscopic changes were observed in Si-ARC/SoC following treatment. The treated SoC/Si-ARC hardmask films were exposed to the polyoxometal solutions for 5 min. No chemical attack was observed. All materials are chemically compatible to at least 250° C. SoC itself is unstable with respect to heating above this temperature in air. The $AlO_x(PO_4)_y$ provides an apparent $O_2$ diffusion barrier, preventing oxidation.

In summary, the Si-ARC and SoC wafers illustrated here appear to be hydrophilic and coatable after simple UVO treatment. The polyoxometal solutions do not appear to strongly attack underlayers such as these particular Si-ARC or SoC layers. Demonstrating surface treatment, suitable coating quality, and chemical compatibility are important objectives with respect to demonstrated feasibility for depositing a metal oxide film from and aqueous polyoxometal precursor for further use as a hardmask. The surface treatment and compatibility results described herein are valid only for the specific polyoxometal precursors and Si-ARC/SoC films tested, although it is expected that one or more of the surface treatments described herein generally can be useful for the pretreatment of many suitable surfaces. Different precursor solutions and/or Si-ARC and SoC film modifications will interact differently, and these interactions may be tunable with precursor chemistry.

Example 4

Coating of Metal Oxide Hardmask on SoC or Si-ARC Substrate Surfaces

Coating Formation

A 5 min UVO treatment was used to make substrate surfaces, such as SoC or Si-ARC, hydrophilic. The polyoxometal solution made according to the process outlined in example 1 was coated onto the pretreated substrate surfaces. A lithography spin coater was then used to coat the substrate surfaces. Using SoC coated wafer as an example, a SoC coated silicon wafer was loaded onto a spin coater, and the polyoxometal solution was dispensed onto the center of the wafer. The amount of polyoxometal solution dispensed was selected based on the desired coating thickness and on the size of the wafer. The spin coater was spun at 100 RPM for 5 seconds to spread the metal oxide across the wafer and then at 3000 RPM for 30-60 seconds to cast the metal suboxide film. The coated wafer was then subjected to 1 min 250° C. post apply bake (PAB) followed by a 10 min furnace hard bake at 250, 300, 350, or 400 degree Celsius with no heating ramp. The compatibility of Ti:$ZrO_x(SO_4)_y$ hard masks with SoC or Si-ARC were visually evaluated, and the results are shown in Table 12.

TABLE 12

| Patterning Underlayer | Bake (° C.) | Coat Quality | Observations on Hardbake |
|---|---|---|---|
| SoC | 250 | Good | No Change |
| SoC | 300 | Good | Film Disruption |
| SoC | 350 | Good | on Heating |
| SoC | 400 | Good | |
| Si-ARC | 250 | Good | No Change |
| Si-ARC | 300 | Good | No Change |
| Si-ARC | 350 | Good | No Change |
| Si-ARC | 400 | Good | No Change |

The compatibility of $AlO_x(PO_4)_y$ hard masks with SoC or Si-ARC were evaluated and the results are shown in Table 13. Because $AlO_x(PO_4)_y$ has a lower index of refraction, resulting film stacks are more difficult to visually evaluate for thickness/film in-homogeneity.

TABLE 13

| Patterning Underlayer | Bake (° C.) | Coat Quality | Observations on Hardbake |
|---|---|---|---|
| SoC | 250 | Good | No Change |
| SoC | 300 | Good | No Change |
| SoC | 350 | Good | No Change |
| SoC | 400 | Good | Possible in-homogeneities |
| Si-ARC | 250 | Fair | No Change |
| Si-ARC | 300 | Fair | No Change |
| Si-ARC | 350 | Fair | No Change |
| Si-ARC | 400 | Fair | No Change |

The compatibility of $HfO_x(SO_4)_y$ hard masks with SoC or Si-ARC was evaluated and the results are shown in Table 14.

TABLE 14

| Patterning Underlayer | Bake (° C.) | Coat Quality | Observations on Hardbake |
|---|---|---|---|
| SoC | 250 | Fair | No Change |
| SoC | 300 | Fair | Film Disruption |
| SoC | 350 | Fair | on Heating |
| SoC | 400 | Fair | |
| Si-ARC | 250 | Good | No Change |
| Si-ARC | 300 | Good | No Change |
| Si-ARC | 350 | Good | No Change |
| Si-ARC | 400 | Good | No Change |

Example 5

The Coating Defectivity, Wafer Uniformity, and Wet Rework Defectivity of the Metal Oxide Hardmask The coating defectivity, spin-coat uniformity on 300-mm wafers, and wet rework defectivity of similar materials has previously been discussed in Jason K. Stowers, et al, "Directly patterned inorganic hardmask for EUV lithography", Proc. SPIE 7969, 796915 (2011); http://dx.doi.org/10.1117/12.879542 hereby incorporated by reference. Highlights are summarized here for illustrative purposes in the metal oxide hardmask application.

Figure 7B:
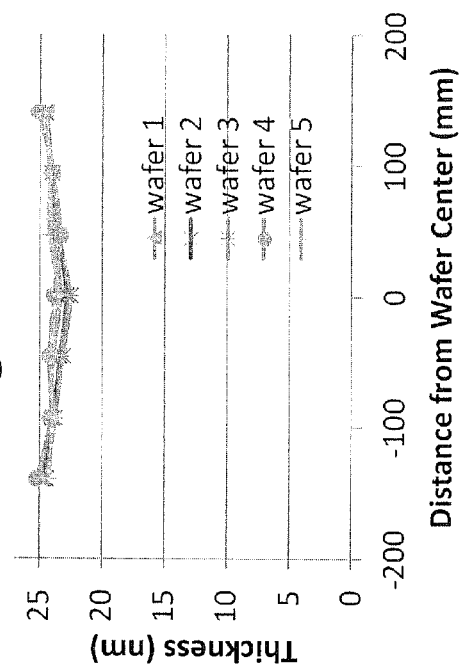
FIG. 7B is a plot of the wafer coating uniformity of the metal oxide hardmasks on 300 mm wafers.
Figure 7A:
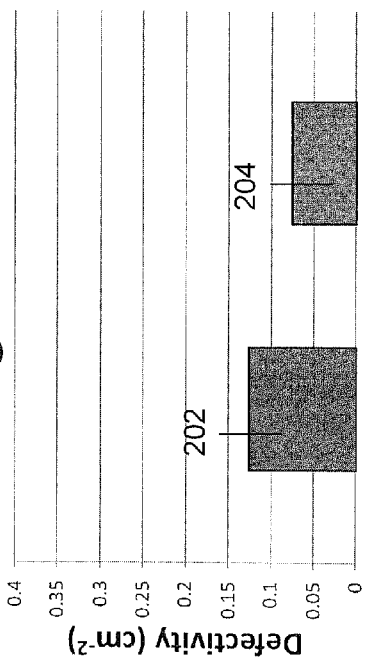
FIG. 7A is a plot of the coating defectivity of the hafnium oxide hardmasks and a water control.

The coating defectivity of the $HfO_x(SO_4)_y$ hardmasks was evaluated using Confocal scanning laser microscopy with dispensed water as a control and the results are shown in FIG. 7A. The defects can be attributed to manual dispense with un-optimized 0.2 μm filter. The hardmask itself is not a significant source of defects larger than the filter size. As shown in FIG. 7A, the defectivity 204 of the hardmask is lower than the control defectivity 202 of the water. No major defect source has been detected.

The wafer coating uniformity of the metal oxide hardmasks on a 300 mm wafer was evaluated and the results are shown in FIG. 7B. The hardmask precursor solutions were hand dispensed on wafers 1-5 at locations with different distances from the wafer center. As shown in FIG. 7B, reproducible uniform coatings with the thickness difference range of about 1.5 nm on a single wafer have been achieved.

Figure 7C:
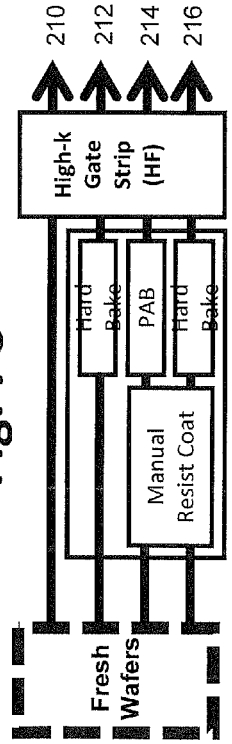
FIG. 7C is a plot of a flow chart procedure used in the wet rework defectivity of the wafers under different processing conditions.
Figure 7D:
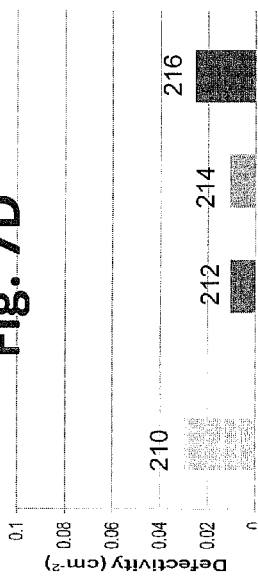
FIG. 7D is a plot of the defectivity of wafers after the treatment outlined in FIG. 7C.

The wet rework defectivity of the wafers was evaluated following a flow chart procedure outlined in FIG. 7C. The purpose of the evaluation is to determine if the hardmask film can be successfully stripped to a return a wafer to a pre-coated defectivity level. Sample 210 is a fresh wafer without any treatment. Sample 212 is a fresh wafer that went through hard bake before going through the high-k gate strip with HF. Sample 214 is a fresh wafer after being manually coated with resist and then subjected to post apply bake (PAB) treatment before going through the high-k gate strip with dilute hydrofluoric acid (HF). Sample 216 is a fresh wafer being manually coated with resist and then subjected to hard bake before going through the high-k gate strip with HF. The defectivity of wafers were then evaluated and shown in FIG. 7D. The resist coating demonstrated baseline rework process.

Example 6

Metal Oxide Hardmask Film Shrinkage During Hard Bake

Figure 8:
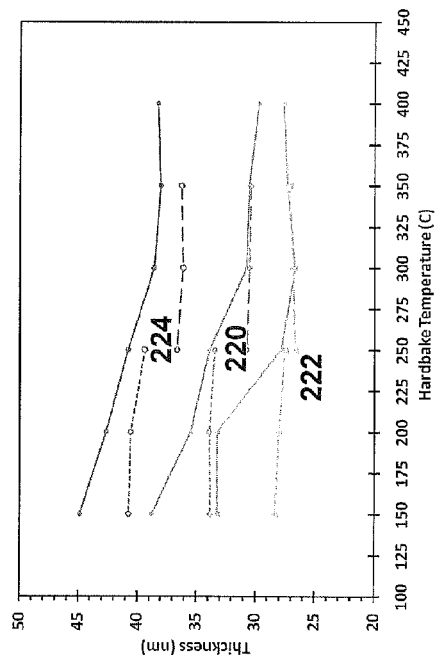
FIG. 8 is a plot of the hard bake film shrinkage of metal oxide hardmasks at various baking temperatures.

Potential thermally induced shrinkage of the metal oxide hardmask was evaluated and the results are shown in FIG. 8. Three metal oxide hardmask samples were prepared. Sample 220 comprises $Ti:ZrO_x(SO_4)_y$, sample 222 comprises hafnium oxide sulfate $HfO_x(SO_4)_y$, and sample 224 comprises aluminum oxide phosphate, $AlO_x(PO_4)_y$. In the first set of experiments, the hardmask precursor solutions samples were spin coated onto silicon wafers as coatings followed by a post apply bake (PAB) at 150° C. for 5 min. The films were then subjected to secondary hard bakes at selected temperatures between 150 to 400° C. for 10 min. Resulting film thickness as a function of hard-bake temperature is summarized in FIG. 8 as solid lines. In the second set of experiments, the hardmask samples were applied onto silicon wafers as coatings, initially hardbaked at 250° C. and then subjected to a 10 min rebake at selected temperatures. Resulting film thickness is shown in FIG. 8 as dotted lines. In the third set of experiments, the hardmask samples were spin coated onto silicon wafers as coatings, initially hardbaked at 350° C. and then subjected to a 10 min rebake at selected temperatures, and the results are shown in FIG. 8 as dashed lines. Sample 222 with $HfO_x(SO_4)_y$ and sample 220 with $Ti:ZrO_x(SO_4)_y$ had a thickness change of <1.7%, or about 1 nm when re-baked at or below original hardbake temperature, which did not significantly change. Sample 224 with $AlO_x(PO_4)_y$ showed a maximum shrinkage of ~5% or ~2 nm for a 40 nm film when heated again at or below the original hardbake temperature.

Example 7

Metal Oxide Hardmask Etch Selectivity Studies

Etch Selectivity in $CHF_3$

The etch selectivity between a hafnium oxide based hardmask and a layer of $SiN_x$ with respect to a plasma $CHF_3$ etch was evaluated under two sets of etch conditions, and results are shown in Table 15. Under the low power $CHF_3$ reactive ion etch regime outlined in test 1 of Table 15, high selectivity ratio of over 800 for $SiN_x$ over the Hf-oxide has been achieved.

TABLE 15

| Test | $CHF_3$ Flow (sccm) | $O_2$ Flow (sccm) | Time (min) | Pressure (mTorr) | RF Power (W) | ICP Power (W) | Table Temp (° C.) | He Backing (sccm) | Etch Rates (Å/min) | | Etch Selectivity |
|---|---|---|---|---|---|---|---|---|---|---|---|
| | | | | | | | | | $SiN_x$ | Hf-oxide | $Hf/SiN_x$ |
| 1 | 50 | 5 | 1:00 | 22 | 30 | 1000 | 20 | 15 | 273.07 | 0.33 | 827 |
| 2 | 50 | 5 | 1:00 | 55 | 150 | 0 | 22 | 0 | 492.2 | 66.2 | 7.4 |

The etch conditions of test 1 were applied to pattern a hafnium oxide hardmask on a 100 nm film of $SiN_x$, and the results are shown in FIGS. 9A-9C. FIG. 9A shows patterned hafnium oxide on 100 nm $SiN_x$. FIG. 9B shows enlarged inner rings in zone plate after etch. FIG. 9C shows enlarged outer ring with spacing=19 nm. In conclusion, <40 nm pitch rings can be etched in 100 nm $SiN_x$ with less than 20 nm thickness Hf-oxide hardmask.

The etch selectivity of a metal oxide hardmask sample against hydrogen silsesquioxane (HSQ) resist under different etching conditions was evaluated, and the results are plotted in FIG. 10A. As shown in FIG. 10A, high selectivity ratio of above 100:1 was achieved for the $HfO_x(SO_4)_y$ based hardmask versus HSQ in plasma based fluoroform and oxygen reactive ion etching ($CHF_3+O_2$ plasma etch) conditions. Similar high selectivity with respect to Si was also achieved for $SF_6$ plasma etching. For example, a patterned $HfO_x(SO_4)_y$ hardmask on a silicon wafer substrate was treated with, a $SF_6$ plasma etch. As shown in FIG. 10B, silicon posts >360 nm tall and ~40 nm in diameter were formed on a silicon wafer. A patterned $HfO_x(SO_4)_y$ hardmask on HSQ was treated with a $CHF_3+O_2$ plasma etch. As shown in FIG. 10C, 100 nm HSQ lines were formed.

Etch Selectivity in $BCl_3$ $BCl_3$ has potential for selective plasma etch of oxides relative to ArF/EUV resists and SoC/Si-ARC at a high etch rates, even with little etch optimization. Even considering possible etcher instability, Ti:Zr-oxides and HEW-oxides have etch selectivity >1 relative to ArF resists. $AlO_x(PO_4)_y$ etches considerably slower in $BCl_3$ leading to low selectivity to ArF resists, possibly due to $BPO_4$ formation. The $BCl_3$ etch conditions used are specified in Table 16. The etch rates and etch selectivity of $BCl_3$ on different substrates are specified in Tables 17 and 18 respectively. Most of the oxide materials disclosed herein have a selectivity ratio above 1:7 with respect to organic films such as SoC in $BCl_3$ plasma, while having high resistance to $O_2$ plasma etch/strip.

TABLE 16

| Test | $BCl_3$ Flow (sccm) | Time (min) | Pressure (mTorr) | RF Power (W) | ICP Power (W) | Table Temp (° C.) | He Backing (sccm) |
|---|---|---|---|---|---|---|---|
| 1 | 40 | 2:00 | 10 | 10 | 2000 | 20 | 15 |

TABLE 17

| | Si-ARC | SoC | EUV | ArF | $HfO_x(SO_4)_y$ | $AlO_x(PO_4)_y$ | Ti: $ZrO_x(SO_4)_y$ | Hf: $WO_x(SO_4)_y$ |
|---|---|---|---|---|---|---|---|---|
| Etch Rates Å/min | 25.86 | −8.72 | 25.91 | 18.96 | 133.80 | 117.98 | 341.51 | 339.48 |
| Initial Thickness (Å) | 258 | 1608 | 465 | 985 | 753 | 410 | 708 | 874 |

TABLE 18

| | Si-ARC | SoC | EUV | ArF |
|---|---|---|---|---|
| $HfO_x(SO_4)_y$ | 5.2 | >100 | 5.2 | 7.1 |
| $AlO_x(PO_4)_y$ | | | 4.6 | 6.2 |
| Ti: $ZrO_x(SO_4)_y$ | | | 13.2 | 18.0 |
| Hf: $WO_x(SO_4)_y$ | | | 13.1 | 17.9 |

Etch Selectivity with $O_2/N_2$ Plasma Etch

As expected, all oxides have very low etch rates in $O_2$ ($O_2/N_2$) using the etch conditions specified in Table 19. The etch rates and etch selectivity of $O_2/N_2$ on different substrates are specified in Tables 20 and 21 respectively.

TABLE 19

| Test | $O_2/N_2$ Flow (Sccm) | Time (min) | Pressure (mTorr) | RF Power (W) | ICP Power (W) | Table Temp (° C.) | He Backing (sccm) |
|---|---|---|---|---|---|---|---|
| 1 | 30/0 | 1:00 | 15 | 15 | 1000 | 20 | 15 |
| 2 | 60/50 | 2:00 | 10 | 150 | 750 | 20 | 15 |

TABLE 20

| | Etch Rates (Å/min) | | | | | | | |
|---|---|---|---|---|---|---|---|---|
| Test | Si-ARC | SoC | EUV | ArF | $AlO_x(PO_4)_y$ | Ti: $ZrO_x(SO_4)_y$ | Hf: $WO_x(SO_4)_y$ | $HfO_x(SO_4)_y$ |
| 1 | 59.72 | >1600 | >465 | >985 | | | | 0.30 |
| 2 | 61.01 | >804.08 | | | 39.73 | 28.11 | 42.08 | 36.8 |

TABLE 21

| | Si-ARC | EUV | ArF | SoC |
|---|---|---|---|---|
| $HfO_x(SO_4)_y$ test 1 | 199.07 | >1500 | >3000 | >5000 |
| $HfO_x(SO_4)_y$ test2 | | | | >20 |
| $AlO_x(PO_4)_y$ | | | | >20 |
| Ti: $ZrO_x(SO_4)_y$ | | | | >28 |
| Hf: $WO_x(SO_4)_y$ | | | | >19 |

Example 8

Pattern Transfer Using Metal Oxide Hardmasks

Unless otherwise specified, the resist in this example was patterned with e-beam lithography. Electron beam exposures for pattern formation were conducted at 30-keV beam voltage on a Zeiss Ultra FEG SEM with a Nabity lithography system. The CAR layer, a phenolic resin-based resist sensitive to EUV and electron beam, was applied with a thickness of 40-45 nm by spin coating on a silicon wafer, followed by a post-apply bake (PAB) of 130° C. for 60 s. After exposure, a post-exposure bake (PEB) of 110° C. for 60 s was used prior to development in 2.38% TMAH. The PAB, hardbake, PEB conditions for SoC hardmask, $HfO_x(SO_4)_y$, $AlO_x(PO_4)_y$—$HfO_x(SO_4)_y$ and resist are summarized in Table 22 below.

TABLE 22

| Split | Material | Thick (nm) | PAB | Hardbake | PEB |
|---|---|---|---|---|---|
| Carbon Hardmask | SoC | 180 | 250° C./60 s | | |
| Oxide Hardmask 1 | $HfO_x(SO_4)_y$ | 6.5 | | 250° C./600 s | |
| Oxide Hardmask 2 | $AlO_x(PO_4)_y$—$HfO_x(SO_4)_y$ | 11 | | 250/60 s | |
| Resist | EUV/EB Resist | 43 | 130° C./60 s | | 110° C./60 s |

The metal oxide coating materials $HfO_x(SO_4)_y$ and a mixture of $AlO_x(PO_4)_y$ and $HfO_x(SO_4)_y$ were produced and applied to a silicon wafer according to the methods specified in the earlier examples above. Oxide Hardmask 1, a $HfO_x(SO_4)_y$ film was deposited at a thickness of 6.5 nm while Oxide Hardmask 2, a bilayer of $AlO_x(PO_4)_y$ and $HfO_x(SO_4)_y$ was deposited at a total thickness of 11 nm. A CAR was irradiated with an electron beam and developed with 2.38 weight percent TMAH using a dip method. The developer was contacted with the wafer for 60 seconds. Then, the wafer was rinsed with water and dried.

High-Resolution CAR Pattern Formation on Using Hafnium Oxide Hardmasks

A substrate, such as a silicon wafer, can be etched with or without hardmasks. An organic resist 242 such as a CAR directly deposited on a silicon substrate 244 is shown in the cartoon of FIG. 11A. In comparison, a $HfO_x(SO_4)_y$ layer (Oxide Hardmask 1) 254 deposited between an organic resist 252 such as a CAR and a substrate 256 such as silicon is shown in the cartoon of FIG. 12A. $HfO_x(SO_4)_y$ 264 used on top of another hardmask such as a SoC or Si-ARC layer 266 between an organic resist 262 such as a CAR and a substrate 268 such as silicon is shown in the cartoon of FIG. 13. Cartoons in FIGS. 11A, 12A, and 13 thus represent three useful stack structures used to etch a substrate. However, a critical first step for high-resolution pattern transfer is resist pattern exposure and development on the hardmask prior to etching. The resist 242 in FIG. 11A was patterned with an e-beam and developed to form a patterned resist 246 on the Si substrate 244 shown in FIG. 11B. A SEM image of a patterned resist with a 30 nm half-pitch (hp) line/space (L/S) pattern formed with a CAR on a silicon wafer exposed at an e-beam dose of 28 µC/cm² is shown in FIG. 11C. The resist 252 in FIG. 12A was similarly patterned with an e-beam and developed to form a patterned resist 258 on the Si substrate 256 shown in FIG. 12B. Likewise, a 30 nm half-pitch resist line/space pattern formed using the same CAR material deposited on 6.5 nm of $HfO_x(SO_4)_y$ film on a silicon wafer exposed with an e-beam dose of 31 µC/cm² is shown in FIG. 12C. These results indicate that high-resolution CAR performance is very similar on the oxide hardmask material compared to the baseline Si wafer.

High Resolution (60-Nm HP) Pattern Transfer Using $HfO_x(SO_4)_y$ Hardmask on Silicon As shown in FIGS. 14A-14D, high-aspect ratio pattern transfer into Si is possible with a 6.5 nm oxide hardmask using an e-beam CAR and corresponding patterning. Referring to FIGS. 14A-14D, the CAR exposure and development steps are illustrated. FIG. 14A is a cartoon of the patterned resist 272 on the Si substrate 276 with the 6.5 nm $HfO_x(SO_4)_y$ layer (Oxide Hardmask 1) 274 in between. FIG. 14B shows a SEM cross-section image of the ca. 43 nm thick e-beam patterned 60 nm half-pitch CAR lines. FIG. 14C is a large-area top-down view of the patterned resist lines of FIG. 14B. FIG. 14D is an oblique perspective image of 100 nm hp CAR lines of patterned on the same wafer as those in FIG. 14B.

Referring to FIG. 15A-15C, the metal oxide hardmask etch step is illustrated. FIG. 15A is a cartoon of the etched $HfO_x(SO_4)_y$ layer 278 on the Si substrate 276 with the patterned CAR resist 272 remaining. FIG. 15B shows a SEM image of the etched cross section of the metal-oxide hardmask after a $CHF_3$ Plasma etch. FIG. 15C is the top view of the etched layer of FIG. 15B, showing the etched 60 nm half-pitch hardmask/resist lines. Referring to FIG. 16A-16D, the resist strip step is illustrated. FIG. 16A is a cartoon of etched metal oxide hardmask 278 with the resist removed on the Si substrate 276. FIG. 16B shows a SEM image of the etched hardmask 278 cross section with the CAR layer removed using an $O_2$/Ar plasma strip. FIG. 16C is a top view of the etched hardmask 278 with the CAR resist of FIG. 16B removed. FIG. 16D is oblique view of the etched hardmask 278 with the CAR layer from FIG. 16B removed. Referring to FIG. 17A-17D, the silicon etching step is illustrated. FIG. 17A is a cartoon of etched silicon 280 with some metal oxide hardmask 278 remaining. FIG. 17B shows a SEM cross section of the etched silicon 60-nm hp lines, processed using a $SF_6/O_2$ cryogenic plasma etch. FIG. 17C is a top view of the etched silicon of FIG. 17B. FIG. 17D is the side perspective view of the etched silicon of FIG. 17B.

High Resolution Pattern Transfer Using an Oxide Hardmask with Conventional SoC Material The metal oxide hardmasks are demonstrated to be compatible with conventional SoC materials in tri-layer stacks in this example. As shown in FIGS. 18A-20C, pattern transfer into SoC material is possible with an 11-nm $AlO_x(PO_4)_y$—$HfO_x(SO_4)_y$ hardmask using a typical phenolic resin-based CAR patterned via an electron beam. Referring to FIG. 18A-18C, the CAR layer exposure and development steps are illustrated. FIG. 18A is a cartoon of the patterned CAR layer 282 on the silicon substrate 288 with the 11 nm hafnium sulfate oxide, aluminum oxide bilayer 284 and a spin-on carbon (SoC) hardmask layer 286 in between. FIG. 18B shows a SEM cross section of the patterned CAR layer, exposed using an e-beam subsequently developed. FIG. 18C is a top-down image of the patterned resist lines of FIG. 18B.

Referring to FIG. 19A-19D, the metal oxide hardmask etch step is illustrated. FIG. 19A is a cartoon of the etched oxide layer 290 on the SoC layer 286 and the Si substrate 288 with some of the patterned CAR layer 282 remaining. FIG. 19B shows a SEM image of the etched cross section of the oxide hardmask layer following a $CHF_3$ plasma etch. FIG. 19C is a top-down view of the etched layer of FIG. 19B, showing the open hardmask lines. FIG. 19D is an oblique view of the etched hardmask 290 of FIG. 19B. Referring to FIG. 20A-20C, the SoC etching step is illustrated. FIG. 20A is a cartoon of etch SoC 292 with the etched metal oxide hardmask 290 remaining. FIG. 20B shows a photo of the etched cross section of the SoC and metal oxide hardmask on the Si substrate, in which an $O_2/N_2$ plasma etch was used. FIG. 20C is the side perspective view of the etched SoC and metal oxide hardmask on the Si substrate of FIG. 20B.

In the foregoing examples conventional CAR EUV/e-beam resist performance on $HfO_x(SO_4)_y$ was shown to be comparable to the same resist on silicon when defining 30-nm HP line/space features. Following this demonstration, standard dry-etch processes were successfully employed to transfer e-beam written ~60 nm HP features >200 nm into Si from a conventional CAR EUV/e-beam resist via a 6.5-nm $HfO_x(SO_4)_y$ hardmask. A trilayer lithography stack was likewise successfully demonstrated with a multicomponent oxide hardmask and standard SoC/CAR materials.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

What is claimed is:

1. A layered structure comprising:
   a substrate having a surface;
   a hardmask composition comprising polyoxometal clusters and inorganic anions on the substrate surface having an average thickness from about 1 nm to about 50 nm; and
   a distinct radiation patternable resist layer on the metal oxide hardmask layer having an average thickness from about 10 nm to about 1 micron;
   wherein the hardmask composition and the radiation patternable resist layer remain distinct upon exposure to pattern-defined radiation.

2. The layered structure of claim 1 wherein the substrate comprises a silicon wafer.

3. The layered structure of claim 1 wherein the hardmask composition comprises $HfO_x(SO_4)_y$.

4. The layered structure of claim 1 wherein the hardmask composition comprises $AlO_x(PO_4)_y$.

5. The layered structure of claim 1 wherein the hardmask composition comprises $TiZrO_x(SO_4)_y$.

6. The layered structure of claim 1 wherein the metal oxide layer comprises a mixture of $HfO_x(SO_4)_y$ and $AlO_x(PO_4)_y$.

7. The layered structure of claim 1 wherein the metal oxide hardmask layer comprises $Cr^{+6}$, $Mo^{+6}$, $W^{+6}$, $V^{+5}$, $Nb^{+5}$, $Ta^{+5}$, $P^{+5}$, $Sb^{+5}$, $Ti^{+4}$, $Zr^{+4}$, $Hf^{+4}$, $Sn^{+4}$, $Si^{+4}$, $Ce^{+4}$, $Ru^{+4}$, $Sb^{+6}$, $Y^{+3}$, $Ga^{+3}$, $Cr^{+3}$, $Fe^{+3}$, $Co^{3+}$, $Ru^{3+}$, $Al^{+3}$, $In^{+3}$, $Sc^{+3}$, $Bi^{+3}$, $La^{+3}$, $Ce^{+3}$, $Pr^{+3}$, $Nd^{+3}$, $Pm^{+3}$, $Sm^{+3}$, $Eu^{+3}$, $Gd^{+3}$, $Tb^{+3}$, $Dy^{+3}$, $Ho^{+3}$, $Er^{+3}$, $Tm^{+3}$, $Yb^{+3}$, $Lu^{+3}$, $Zn^{+2}$, $Co^{2+}$, $Ni^{2+}$, $Mn^{+2}$, $Mg^{+2}$, $Ca^{+2}$, $Sr^{+2}$, $Ba^{+2}$, or combinations thereof.

8. The layered structure of claim 1 wherein the resist layer comprises aliphatic copolymer structures, partially protected phenolic structures, hybrid aliphatic/phenolic structures, poly(hydroxystyrene), poly(methyl methacrylate) (PMMA), poly(methyl glutarimide) (PMGI), phenol formaldehyde resin, DNQ, epoxy resin, or a combination thereof.

9. The layered structure of claim 1 further comprising a 10 nm to about 1 micron thick spin-on-carbon (SOC) hardmask, vapor-deposited hardmask, silicon based anti-reflection layer (Si-ARC), or a combination thereof between the metal oxide layer and the substrate layer.

10. The layered structure of claim 1 further comprising one or more 10 nm to 1 micron thick layer(s) comprising at least one of a hardmask layer(s) and an antireflective layer(s) between the metal oxide layer and the resist layer.

11. The layered structure of claim 1 wherein the substrate comprises a polymer.

12. The layered structure of claim 10 wherein the hardmask layer comprises silicon nitride, silicon oxynitride, amorphous carbon, or combinations thereof.

13. The layered structure of claim 1 wherein the resist layer comprises an organic compound and the resist layer has an average thickness from about 30 nm to about 200 nm.

14. The layered structure of claim 1 wherein the resist layer is patternable with electron beam radiation.

15. The layered structure of claim 1 wherein the resist layer is patternable with UV light.

16. The layered structure of claim 1 wherein the resist layer comprises an organic polymer that is a positive resist.

17. The layered structure of claim 1 wherein the resist layer comprises an organic polymer that is a negative resist.

18. The layered structure of claim 1 wherein the resist layer following exposure to patterning radiation can be developed to form the pattern with an aqueous base.

19. The layered structure of claim 1 wherein the substrate comprises a silicon wafer, the resist layer comprises an organic polymer and the hardmask layer comprises $Cr^{+6}$, $Mo^{+6}$, $W^{+6}$, $V^{+5}$, $Nb^{+5}$, $Ta^{+5}$, $P^{+5}$, $Sb^{+5}$, $Ti^{+4}$, $Zr^{+4}$, $Hf^{+4}$, $Sn^{+4}$, $Si^{+4}$, $Ce^{+4}$, $Ru^{+4}$, $Sb^{+3}$, $Y^{+3}$, $Ga^{+3}$, $Cr^{+3}$, $Fe^{+3}$, $Co^{3+}$, $Ru^{3+}$, $Al^{+3}$, $In^{+3}$, $Sc^{+3}$, $Bi^{+3}$, $La^{+3}$, $Ce^{+3}$, $Pr^{+3}$, $Nd^{+3}$, $Pm^{+3}$, $Sm^{+3}$, $Eu^{+3}$, $Gd^{+3}$, $Tb^{+3}$, $Dy^{+3}$, $Ho^{+3}$, $Er^{+3}$, $Tm^{+3}$, $Yb^{+3}$, $Lu^{+3}$, $Zn^{+2}$, $Co^{2+}$, $Ni^{2+}$, $Mn^{+2}$, $Mg^{+2}$, $Ca^{+2}$, $Sr^{+2}$, $Ba^{+2}$, or combinations thereof.

* * * * *